US012787318B2

(12) United States Patent
Hashizume

(10) Patent No.: US 12,787,318 B2
(45) Date of Patent: Nov. 3, 2026

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Yuichi Hashizume, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 552 days.

(21) Appl. No.: 18/325,034

(22) Filed: May 29, 2023

(65) Prior Publication Data

US 2024/0021737 A1 Jan. 18, 2024

(30) Foreign Application Priority Data

Jul. 13, 2022 (JP) ................................ 2022-112771

(51) Int. Cl.
*H10D 8/60* (2025.01)
*H10D 8/01* (2025.01)
(Continued)

(52) U.S. Cl.
CPC ............... *H10D 8/60* (2025.01); *H10D 8/051* (2025.01); *H10D 62/107* (2025.01);
(Continued)

(58) Field of Classification Search
CPC .. H10D 8/051; H10D 62/107; H10D 62/8325; H10D 64/64; H10D 64/62;
(Continued)

(56) References Cited

U.S. PATENT DOCUMENTS

2015/0333190 A1 11/2015 Aketa et al.
2017/0077236 A1* 3/2017 Hori .................... H10D 62/106
(Continued)

FOREIGN PATENT DOCUMENTS

JP 2014116471 A 6/2014
JP 2017055009 A 3/2017
(Continued)

OTHER PUBLICATIONS

Office Action issued for corresponding Japanese Patent Application No. 2022-112771 dated Feb. 24, 2026.

*Primary Examiner* — Shahed Ahmed
(74) *Attorney, Agent, or Firm* — Rabin & Berdo, P.C.

(57) ABSTRACT

A silicon carbide semiconductor device has an active region, a first-conductivity-type region, and an edge termination region. The active region has first second-conductivity-type regions, a silicide film, and a first electrode; the edge termination region has a second second-conductivity-type region. The active region is configured by an ohmic region in which the silicide film is in contact with the first second-conductivity-type region, non-operating regions in which the first electrode is in contact with the first second-conductivity-type regions, and a Schottky region in which the first electrode is in contact with the first-conductivity-type region. The ohmic region, the non-operating regions, and the Schottky regions are provided in a striped pattern. A bottom surface of the silicide film in the ohmic region is positioned deeper than is an interface between the first electrode and the first second-conductivity-type regions in each of the plurality of non-operating regions.

9 Claims, 14 Drawing Sheets

(51) Int. Cl.

| | |
|---|---|
| ***H10D 62/10*** | (2025.01) |
| ***H10D 62/832*** | (2025.01) |
| ***H10D 64/01*** | (2025.01) |
| ***H10D 64/64*** | (2025.01) |

(52) U.S. Cl.
CPC ..... *H10D 62/8325* (2025.01); *H10D 64/0123* (2026.01); *H10D 64/64* (2025.01)

(58) Field of Classification Search
CPC .. H10D 62/126; H10D 62/106; H10D 62/105; H10D 8/60–605; H10D 84/013–0133; H01L 21/0445–0495
See application file for complete search history.

(56) References Cited

U.S. PATENT DOCUMENTS

| | | | | |
|---|---|---|---|---|
| 2021/0074863 | A1 | 3/2021 | Ohse et al. | |
| 2021/0175369 | A1 | 6/2021 | Ohse et al. | |
| 2021/0226031 | A1* | 7/2021 | Kojima | H10D 62/106 |
| 2021/0391437 | A1 | 12/2021 | Ohse | |

FOREIGN PATENT DOCUMENTS

| | | | |
|---|---|---|---|
| JP | 6400544 | B2 | 10/2018 |
| JP | 2021044272 | A | 3/2021 |
| JP | 2021093522 | A | 6/2021 |
| JP | 2021197420 | A | 12/2021 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2022-112771, filed on Jul. 13, 2022, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) semiconductors have recently gained attention as a semiconductor material enabling fabrication (manufacture) of a semiconductor device (hereinafter, silicon carbide semiconductor device) that exceeds the limits of a semiconductor device that uses a silicon (Si) semiconductor. In particular, by taking advantage of features of higher breakdown electric field strength and higher thermal conductivity as compared to silicon semiconductors, silicon carbide semiconductors are expected to be applied to high-voltage (for example, 1700V or more) semiconductor devices.

In instances in which a silicon carbide semiconductor device is a diode (hereinafter, silicon carbide diode), design specifications of an $n^-$-type epitaxial layer that constitutes an $n^-$-type drift region may be set to include a thinner thickness and a higher impurity concentration and thus, silicon carbide diodes with a breakdown voltage of a class of about 3300V generally have a Schottky barrier diode (SBD) structure.

Normally, in an SBD structure, there is a problem in that electric field strength at bonded surfaces between a semiconductor substrate and a front electrode is high and reverse leakage current increases due to electron tunneling in a Schottky barrier during reverse voltage application or reverse leakage current increases due to surface defects unique to silicon carbide. Thus, in a front side of the semiconductor substrate, a silicon carbide diode has been proposed that adopts a junction barrier Schottky (JBS) structure having a mixture of Schottky junctions and pn junctions.

As a structure of a silicon carbide diode with an SBD structure, a structure of a silicon carbide diode that adopts a JBS structure is described. FIG. 27 is a cross-sectional view depicting a structure of a conventional silicon carbide semiconductor device.

A conventional silicon carbide semiconductor device 140 depicted in FIG. 27 is a vertical silicon carbide diode having, in a front side of a semiconductor substrate 130, in an active region 110, a mixture of a SBD structure constituted by a Schottky junction between an $n^-$-type drift region 112 and a titanium film 131 configuring a front electrode 114, and a JBS structure constituted by pn junctions between $p^+$-type regions 113 and the $n^-$-type drift region 112. Further, a nickel silicide film 133 is provided on the $p^+$-type regions 113 as a lowermost layer of the front electrode 114.

The Schottky junction of the conventional silicon carbide semiconductor device 140 is formed by the $n^-$-type drift region 112 exposed at a front surface of the semiconductor substrate 130, and the front electrode 114 configured by an aluminum alloy film 132 and the titanium film 131 provided on the front surface of the semiconductor substrate 130. The semiconductor substrate 130 is an epitaxial substrate in which an $n^-$-type epitaxial layer constituting the $n^-$-type drift region 112 is stacked on a front surface of an $n^+$-type starting substrate 111 that contains silicon carbide. The $n^+$-type starting substrate 111 is an $n^+$-type cathode region. A back electrode 119 is provided in an entire area of a back surface of the semiconductor substrate 130 and is electrically connected to the $n^+$-type starting substrate 111. Reference numerals 115, 120, 121, 122 are, respectively, a field oxide film, an edge termination region, a field limiting ring (FLR), and a $p^-$-type region configuring a JTE structure.

The $p^+$-type regions 113 are selectively provided in the semiconductor substrate 130, at the front surface of the semiconductor substrate 130, in the active region 110. Between the $p^+$-type regions 113 that are adjacent to one another, the $n^-$-type drift region 112 is exposed at the front surface of the semiconductor substrate 130. At the front surface of the semiconductor substrate 130, pn junctions between the $p^+$-type regions 113 and the $n^-$-type drift region 112 are formed. Portions of the $n^-$-type drift region 112 between the $p^+$-type regions 113 that are adjacent to one another form Schottky junctions with the titanium film 131 of the lowermost layer of the front electrode 114 provided on the front surface of the semiconductor substrate 130.

By such a structure, when a rated current flows in a forward direction, current flows by a Schottky junction region of the $n^-$-type drift region 112 other than the $p^+$-type regions 113. Furthermore, when a surge current flows due to lightening or the like, the flow of current cannot be limited to the Schottky junction region and thus, the $p^+$-type regions 113 operate bipolarly and current flows. Further, on the $p^+$-type regions 113, the nickel silicide film 133 constituting an ohmic region is provided, whereby bipolar operation is facilitated by only a striped structure of the $p^+$-type regions 113.

Further, to provide a highly reliable silicon carbide semiconductor device, a semiconductor device has been proposed in which an ohmic electrode borders the front surface of the semiconductor substrate; the ohmic electrode has a first portion that protrudes from the front surface of the semiconductor substrate in a direction from the front surface of the semiconductor substrate, and a second portion that protrudes into the semiconductor substrate, from the front surface of the semiconductor substrate in a depth direction; and the ohmic electrode has, in a cross-sectional view of the semiconductor device, a shape in which a width of the second portion is greater than a width of the first portion (for example, refer to Japanese Laid-Open Patent Publication No. 2021-197420).

Further, to enable suppression of device destruction during reverse bias, a semiconductor device has been proposed that has a trench-type JBS in which p-type regions are provided at bottoms of trenches formed in a device region (for example, refer to Japanese Patent No. 6400544).

SUMMARY OF THE INVENTION

According to an embodiment of the invention, a silicon carbide semiconductor device includes: a semiconductor substrate containing silicon carbide and having an active region and an edge termination region that surrounds a periphery of the active region, the semiconductor substrate having a first main surface and a second main surface that are opposite to each other; a first-conductivity-type region provided in the semiconductor substrate and exposed at the first main surface of the semiconductor substrate, the first-conductivity-type region having a first surface and a second surface that are opposite to each other, the first surface being exposed at the first main surface of the semiconductor substrate; a first trench in the active region, provided in the first-conductivity-type region from the first surface of the first-conductivity-type region; a first second-conductivity-type region provided at a bottom of the first trench, in the active region, the first second-conductivity-type region being in contact with the first-conductivity-type region; a first electrode in contact with the first second-conductivity-type region and the first-conductivity-type region, the first electrode including a silicide film in ohmic contact with the first second-conductivity-type region; a second electrode provided at the second main surface of the semiconductor substrate; and a second second-conductivity-type region surrounding the active region and provided in the edge termination region. The active region is configured by an ohmic region in which the silicide film is in contact with the first second-conductivity-type region, a plurality of non-operating regions in which the first electrode is in contact with the first second-conductivity-type region, and a Schottky region in which the first electrode is in contact with the first-conductivity-type region. The ohmic region, the plurality of non-operating regions, and the Schottky region form a striped pattern, stripes of which extend in a first direction. A bottom of the silicide film that is a portion of the silicide film closer to the second main surface of the semiconductor substrate than are the rest of portions of the silicide film in the ohmic region is positioned closer to the second main surface of the semiconductor substrate than is an interface between the first electrode and the first second-conductivity-type region in each of the plurality of non-operating regions.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
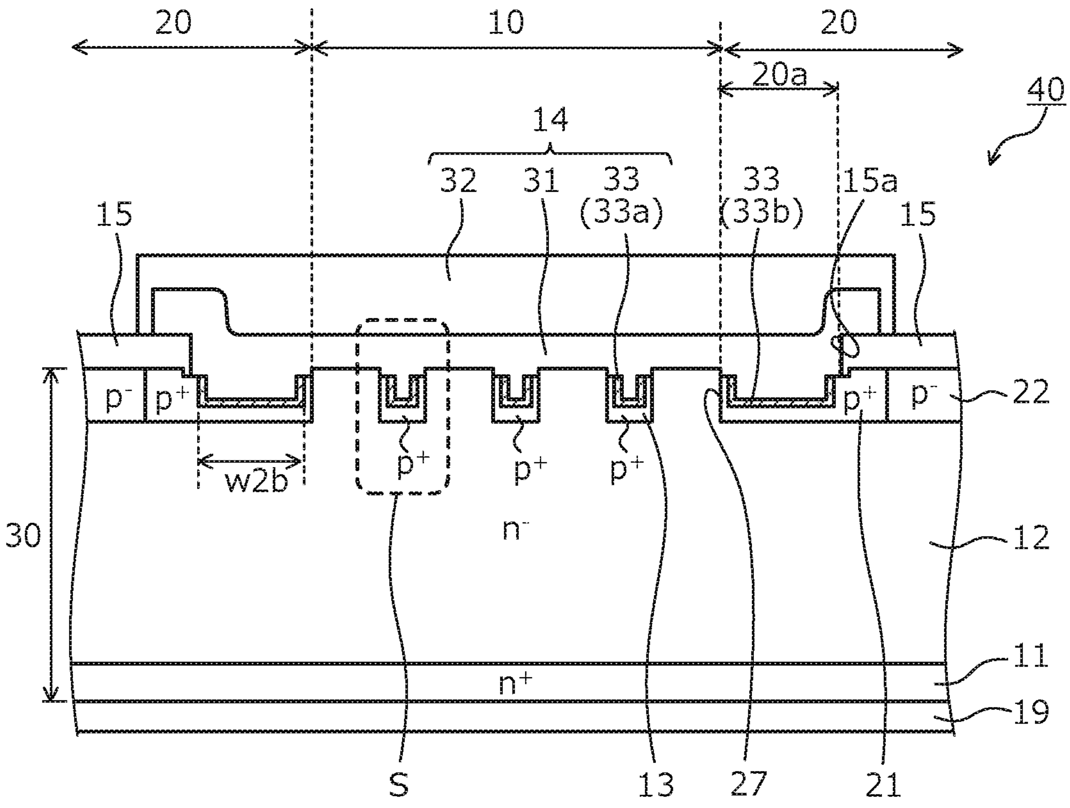
FIG. 1 is a cross-sectional view depicting a structure of a silicon carbide semiconductor device according to a first embodiment.

First, problems associated with the conventional techniques are discussed. When surge current flows in the $p^+$-type regions 113, due to contact resistance of the $p^+$-type regions 113, the bipolar operation of the $p^+$-type regions 113 is delayed, the semiconductor device generates heat and may be destroyed. Furthermore, when a $p^+$-type region is provided in addition to the striped structure of the normal $p^+$-type regions 113, an area of the Schottky junction region of the $n^-$-type drift region 112 decreases, forward voltage Vf during the rated current increases, and the on-voltage increases. In this manner, when the area of the $p^+$-type regions 113 is increased to ensure surge current withstanding capability (IFSM), there is a tradeoff in that that Vf increases. Furthermore, in a structure in which ohmic regions on a semiconductor device of a dot-structure or the like are independent, problems arise in that resistance is biased, local heat generation is facilitated, and surge withstanding capability is difficult to ensure.

Embodiments of a silicon carbide semiconductor device and method of manufacturing a silicon carbide semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are not repeatedly described. Further, in the present description, when Miller indices are described, "−" means a bar added to an index immediately after the "−", and a negative index is expressed by prefixing "−" to the index.

Figure 2:
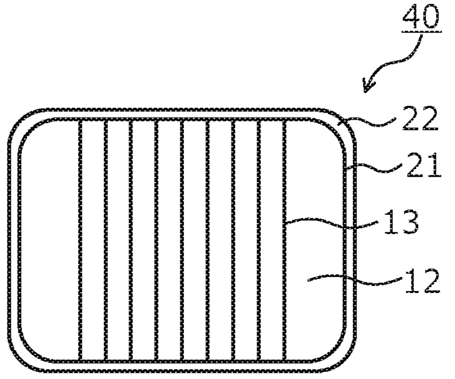
FIG. 2 is a plan view depicting a layout when the silicon carbide semiconductor device according to the first embodiment is viewed from a front side of a semiconductor substrate thereof.

A structure of a silicon carbide semiconductor device according to a first embodiment is described. FIG. 1 is a cross-sectional view depicting the structure of the silicon carbide semiconductor device according to the first embodiment. FIG. 2 is a plan view depicting a layout when the silicon carbide semiconductor device according to the first embodiment is viewed from a front side of a semiconductor substrate thereof. A silicon carbide semiconductor device 40 according to the first embodiment depicted in FIGS. 1 and 2 is a silicon carbide diode having, in a front side of a semiconductor substrate 30, in an active region 10, a mixture of a SBD structure configured by a Schottky junction between a front electrode (first electrode) 14 and an $n^-$-type drift region (first-conductivity-type region) 12, and a JBS structure configured by pn junctions between $p^+$-type regions (first second-conductivity-type regions) 13 and the $n^-$-type drift region 12.

The $n^-$-type drift region 12 and the $p^+$-type regions 13 are arranged substantially evenly in a substantially uniform pattern in the active region 10, at the surface thereof. The $n^-$-type drift region 12 and the $p^+$-type regions 13, for example, are arranged in a striped pattern extending in a same direction parallel to a front surface of the semiconductor substrate 30, the $n^-$-type drift region 12 and the $p^+$-type regions 13 repeatedly alternating with one another and being in contact with one another in a lateral direction that is orthogonal to a longitudinal direction in which the striped pattern extends (refer to FIG. 2). The $n^-$-type drift region 12 is exposed at the front surface of the semiconductor substrate 30, between the $p^+$-type regions 13 that are adjacent to one another.

The active region 10 is a region through which current flows when the silicon carbide diode is in an on-state. The active region 10, for example, has a substantially rectangular shape in the plan view of the semiconductor device and is disposed in substantially a center of the semiconductor substrate 30. An edge termination region 20 is a region between the active region 10 and an end of the semiconductor substrate 30 and surrounds a periphery of the active region 10. The edge termination region 20 is a region that mitigates electric field of the $n^-$-type drift region 12 in the front side of the semiconductor substrate 30 and sustains a breakdown voltage. The breakdown voltage is a voltage limit at which no malfunction or destruction of the device occurs.

In the edge termination region 20, a voltage withstanding structure such as a junction termination extension (JTE) structure is disposed. The JTE structure may be a voltage withstanding structure that, in the plan view of the semiconductor device, has a substantially rectangular shape surrounding a periphery of the active region 10 and is constituted by multiple $p^-$-type regions 22 of different impurity concentrations and disposed in descending order of impurity concentration in a direction from the center of the semiconductor substrate 30 to the end of the semiconductor substrate 30.

Further, in a connecting region 20*a* of the edge termination region 20, a field limiting ring (FLR) 21 is disposed. The FLR 21 (second second-conductivity-type region) is a $p^+$-type region that surrounds the periphery of the active region 10 in a substantially rectangular shape (refer to FIG. 2), the FLR 21 extends toward the end of the semiconductor substrate 30, from the connecting region 20*a* of the edge termination region 20 and is in contact with the later-described $p^-$-type regions 22. The FLR 21 may be in contact with the $p^+$-type regions 13 in the longitudinal direction in which the $p^+$-type regions 13 extend in the striped shape. In FIG. 2, while the FLR 21 is depicted singularly, the structure may include two FLRs 21 surrounding the periphery of the active region 10. The FLR 21 may have a same impurity concentration as that of the $p^+$-type regions 13.

The connecting region 20*a* of the edge termination region 20 is a region between the active region 10 and a later-described field oxide film 15, the connecting region 20*a* surrounds the periphery of the active region 10 and connects the active region 10 and the voltage withstanding structure portion of the edge termination region 20. The voltage withstanding structure portion of the edge termination region 20 is a portion in the edge termination region 20, from an inner peripheral end of the later-described field oxide film 15 to the end of the semiconductor substrate (chip end), and a predetermined voltage withstanding structure such as the JTE structure, an $n^+$-type channel stopper region (not depicted), etc. is disposed in the voltage withstanding structure portion.

A front electrode 14 is provided on the front surface of the semiconductor substrate 30, in the active region 10. The front electrode 14 is in contact with and electrically connected to the $n^-$-type drift region 12 and the $p^+$-type regions 13. On the front surface of the semiconductor substrate 30, a passivation film (not depicted) is provided. The passivation film functions as a protective film that protects the device structure of the front side of the semiconductor substrate 30 and the front electrode 14.

The semiconductor substrate 30 is an epitaxial substrate in which an $n^-$-type epitaxial layer constituting the $n^-$-type drift region 12 is stacked on a front surface of an $n^+$-type starting substrate 11 containing silicon carbide. The $n^+$-type starting substrate 11 is an $n^+$-type cathode region. The semiconductor substrate 30 has, as the front surface, a main surface that includes the $n^-$-type drift region 12 (surface of the $n^-$-type epitaxial layer constituting the $n^-$-type drift region 12) and, as a back surface, a main surface that has the $n^+$-type starting substrate 11 (back surface of the $n^+$-type starting substrate 11).

In the active region 10, in the semiconductor substrate 30, at the front surface thereof, one or more of the $p^+$-type regions 13 configuring the JBS structure is selectively provided. The $p^+$-type regions 13 are provided between the front surface of the semiconductor substrate 30 and the $n^-$-type drift region 12. The $p^+$-type regions 13 are exposed at the front surface of the semiconductor substrate 30 and are in contact with the $n^-$-type drift region 12.

In the edge termination region 20, in the semiconductor substrate 30, at the front surface thereof, the FLR 21, one or more p-type regions (herein, 1: $p^-$-type region 22) constituting the JTE structure, and the $n^+$-type channel stopper region (not depicted) are each selectively provided. The FLR 21 is provide in an entire area of the connecting region 20*a* of the edge termination region 20, the FLR 21 extends toward the chip end, from the connecting region 20*a* and is in contact with the $p^-$-type region 22. The active region 10 is closer to the chip center than is the FLR 21.

The $p^-$-type region 22 is disposed adjacent to the FLR 21, closer to the chip end than is the FLR 21 and is apart from the connecting region 20*a* of the edge termination region 20. The $n^+$-type channel stopper region is provided closer to the chip end than is the $p^-$-type region 22 and is apart from the $p^-$-type region 22. The $n^+$-type channel stopper region is exposed at the end of the semiconductor substrate 30 (the chip end).

The FLR 21, the $p^-$-type region 22, and the $n^+$-type channel stopper region are disposed between the front surface of the semiconductor substrate 30 and the $n^-$-type drift region 12. The FLR 21, the $p^-$-type region 22, and the $n^+$-type channel stopper region are exposed at the front surface of the semiconductor substrate 30 and are in contact with the $n^-$-type drift region 12. Respective depths of the FLR 21, the $p^-$-type region 22, and the $n^+$-type channel stopper region, for example, may be equal to a depth of the $p^+$-type regions 13.

The front surface of the semiconductor substrate 30 is covered by the field oxide film 15. The field oxide film 15, for example, may be a stacked film in which a thermal oxide film and a deposited oxide film are sequentially stacked. The thermal oxide film is capable of enhancing adhesiveness between the semiconductor substrate 30 and the field oxide film 15. The field oxide film 15 includes the deposited oxide film, whereby the field oxide film 15 may be formed in less time than in an instance in which the entire field oxide film 15 is a thermal oxide film.

In the field oxide film 15, a contact hole 15*a* that exposes substantially an entire area of the front surface of the semiconductor substrate 30 in the active region 10 is provided. A sidewall (inner peripheral side surface of the field oxide film 15) of the contact hole 15*a* of the field oxide film 15, for example, is substantially orthogonal to the front surface of the semiconductor substrate 30. The contact hole 15*a* of the field oxide film 15 is provided in an entire region from the active region 10 to the connecting region 20*a* of the edge termination region 20.

In the contact hole 15*a* of the field oxide film 15, the $n^-$-type drift region 12 and the $p^+$-type regions 13 in the active region 10, and an inner peripheral portion of the FLR 21 in the edge termination region 20 are exposed. In the contact hole 15*a* of the field oxide film 15, the front electrode 14 that functions as an anode electrode is provided on the front surface of the semiconductor substrate 30, along the front surface of the semiconductor substrate 30.

The front electrode 14 has a stacked structure in which a titanium film 31 and an aluminum alloy film (metal electrode film containing aluminum) 32 are sequentially stacked. Further, a nickel silicide (NiSi) film 33 (33*a*, 33*b*) is selectively provided between the front surface of the semiconductor substrate 30 and the titanium film 31. Specifically, the nickel silicide film 33 (33*a*, 33*b*) is provide between the $p^+$-type region 13 and the front electrode 14 in trenches 25 or between the FLR 21 and the front electrode 14 in the trench 27, explained layer. The nickel silicide film 33 contains aluminum. The nickel silicide film 33 may contain carbon (C). The front electrode 14 may extend outwardly, onto the field oxide film 15.

The titanium film 31 is provided in an entire area of the front surface of the semiconductor substrate 30, in the contact hole 15*a*, and is in contact with the $n^-$-type drift region 12. A portion of the titanium film 31 joined to the $n^-$-type drift region 12 is a Schottky electrode that forms a Schottky junction with the $n^-$-type drift region 12. The titanium film 31 may extend outwardly, onto the field oxide film 15 and, for example, terminate at a position facing the FLR 21 in the depth direction.

The aluminum alloy film 32 covers the entire surface of the titanium film 31, is electrically connected to the titanium film 31, and via the titanium film 31, is electrically connected to the nickel silicide film 33. The aluminum alloy film 32 may extend outwardly, onto the field oxide film 15 to be closer to the chip end than is the titanium film 31 and, for example, may terminate at a position that faces the $p^-$-type region 22 in the depth direction. The aluminum alloy film 32, for example, is an aluminum silicon (AlSi) film. Instead of the aluminum alloy film 32, an aluminum film may be provided.

The nickel silicide film 33 has a first nickel silicide film 33*a* provided between the $p^+$-type regions 13 and the titanium film 31, and a second nickel silicide film 33*b* provided between the FLR 21 and the titanium film 31. Preferably, a width w2*b* of the second nickel silicide film 33*b* may be wider than width w2*a* of the first nickel silicide film 33*a*. The first nickel silicide film 33*a* is an ohmic electrode that is in ohmic contact with the $p^+$-type regions 13. During surge voltage application, surge current is generated in the semiconductor substrate 30 and flows in the forward direction, the first nickel silicide film 33*a* increases the amount of the surge current drawn out from the semiconductor substrate 30 to the front electrode 14 and has a function of enhancing the surge current withstanding capability.

The first nickel silicide film 33*a*, as described above, is formed by causing a portion of the surface of the semiconductor substrate 30 and the metal film 52 to react by a heat treatment, at locations where the $p^+$-type regions 13 and a metal film 52 deposited on the front surface of the semiconductor substrate 30 (refer to FIG. 12) are in contact with another.

Figure 3:
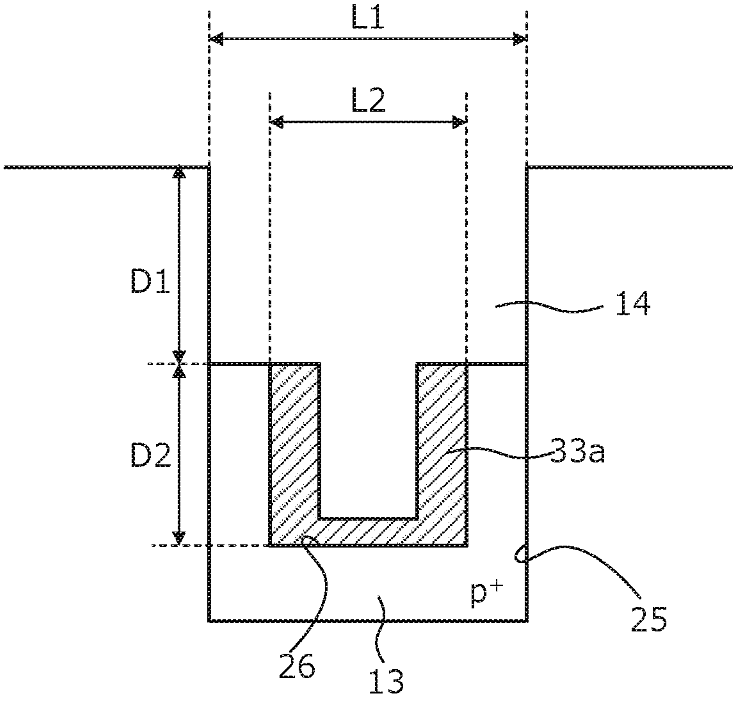
FIG. 3 is a cross-sectional view depicting in detail, a structure of a region S surrounded by a dashed line in FIG. 1.

FIG. 3 is a cross-sectional view depicting in detail, a structure of a region S surrounded by a dashed line in FIG. 1. As depicted in FIG. 3, in a JBS striped structure, a fine ohmic striped structure is provided, having a two-step trench structure. First trenches 25 are provided in the semiconductor substrate 30, at the front surface thereof, and the $p^+$-type regions 13 are provided at bottoms of the first trenches 25. For example, preferably, a width L1 of each of the first trenches 25 may be in a range of 0.7 μm to 3 μm and a depth D1 of each of the first trenches 25 may be in a range of 100 nm to 1000 nm.

The front electrode 14 is embedded in the first trenches 25, and sidewalls of the first trenches 25 are in contact with the front electrode 14. Thus, an area of the SBD structure configured by the Schottky junctions between the front electrode 14 and the $n^-$-type drift region 12 may be increased, the on-voltage increases, and the Vf may be reduced.

Second trenches 26 are provided in the $p^+$-type regions 13 that are at the bottoms of the first trenches 25, and the first nickel silicide film 33*a* is provided at the sidewalls and bottoms of the second trenches 26. Thus, a bottom surface (surface facing the $n^+$-type starting substrate 11) of the first nickel silicide film 33*a* is positioned deeper than are interfaces between the front electrode 14 and the $p^+$-type regions 13. For example, preferably, a width L2 of each of the second trenches 26 may be in a range of 0.5 μm to 2.8 μm and a depth D2 of the second trenches 26 may be in a range of 100 nm to 1000 nm.

The first nickel silicide film 33*a* is provided in each of the second trenches 26, whereby the surface area of the first nickel silicide film 33*a* may be increased. Thus, current easily flows to the $p^+$-type regions 13 during surges and the surge current withstanding capability (IFSM) may be ensured. With this configuration, in the first embodiment, characteristics of both the surge current withstanding capability and the on-voltage may be improved.

Figure 4:
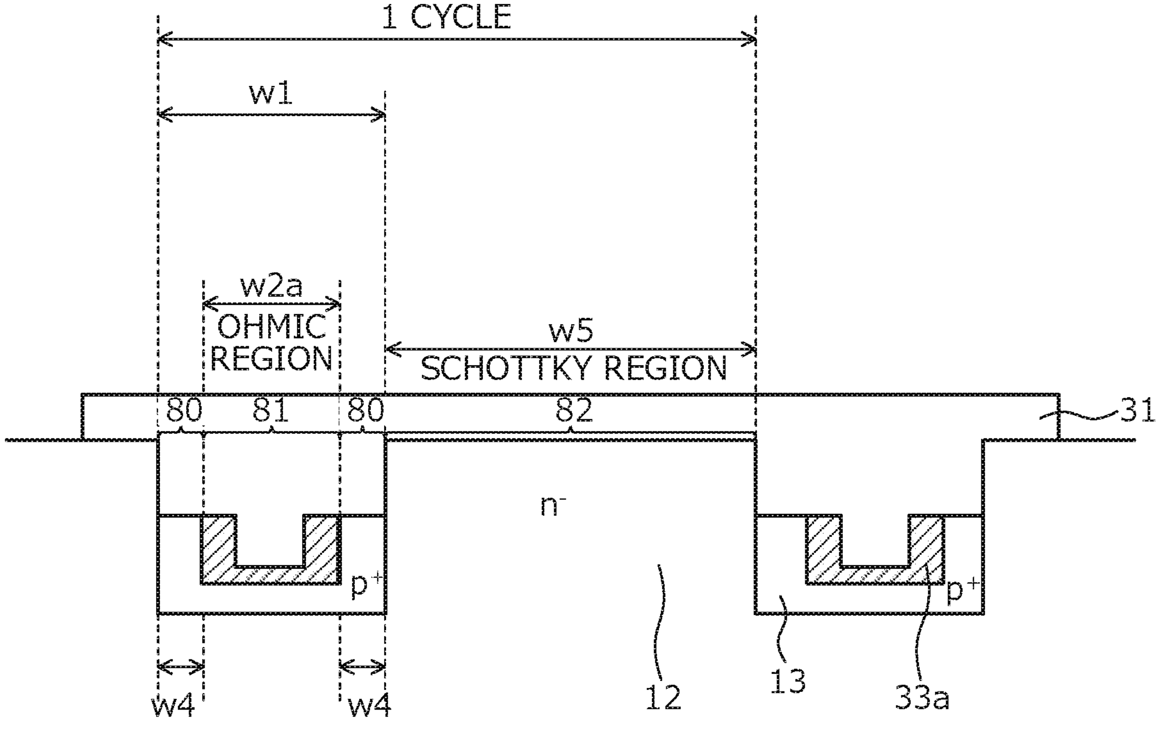
FIG. 4 is a cross-sectional view depicting ohmic regions, non-operating regions, and Schottky regions of the silicon carbide semiconductor device according to the first embodiment.

FIG. 4 is a cross-sectional view depicting ohmic regions, non-operating regions, and Schottky regions of the silicon carbide semiconductor device according to the first embodiment. The active region 10 is configured by stripe-shaped non-operating regions 80 where the titanium film 31 is in contact with the $p^+$-type regions 13 configuring the JBS structure, stripe-shaped ohmic regions 81 where the titanium film 31 is in contact with each first nickel silicide film 33*a* and each first nickel silicide film 33*a* is in contact with a corresponding one of the $p^+$-type regions 13, and stripe-shaped Schottky regions 82 where the titanium film 31 is in contact with the $n^-$-type drift region 12. The stripe-shaped non-operating regions 80, the stripe-shaped ohmic regions 81, and the stripe-shaped Schottky regions 82 each extend in a predetermined direction (first direction). Further, the bottom surface (surface facing the $n^+$-type starting substrate 11) of the first nickel silicide film 33*a* is a bottom of the first nickel silicide film 33*a* that is a portion of the first nickel silicide film 33*a* closest to the $n^+$-type starting substrate 11 than the rest of portions of the nickel silicide film 33*a* in each of the stripe-shaped ohmic regions 81. The bottom of the first nickel silicide film 33*a* is positioned deeper than are interfaces between the front electrode 14 and the $p^+$-type regions 13 in the stripe-shaped non-operating regions 80. In this manner, in the active region 10, a repeating cycle of four regions including one of the ohmic regions 81, two of the non-operating regions 80 surrounding said ohmic region 81, and one of the Schottky regions 82 are provided. Being stripe-shaped means having a long, thin rectangular shape in which a dimension in a lateral direction is shorter than a dimension in a longitudinal direction as depicted in FIG. 2.

This cyclic structure enables the ohmic regions 81 to be disposed densely and uniformly in the active region 10 overall. Thus, when large surge current flows in the forward direction in the semiconductor substrate, the surge current may be distributed and IFSM characteristics may be increased.

Further, preferably, an amount of the surface area of the non-operating regions 80 may be in a range of 5% to 35% of an amount of the surface area of the silicon carbide semiconductor device 40. Further, preferably, the amount of the surface area of the non-operating regions 80 may be in a range of 35% to 90% of an amount of the surface area of the $p^+$-type regions 13. Further, preferably, the amount of the surface area of the non-operating regions 80 may be in a range of 15% to 40% of an amount of the surface area of the active region 10. Rates (percentages) of the surface areas are within these ranges, whereby both enhancement of the surge current withstanding capability and low Vf characteristics may be achieved.

Here, the rate of the surface area of the non-operating regions 80 to the surface area of the silicon carbide semiconductor device 40 is the surface area of the non-operating regions 80/the surface area of the silicon carbide semiconductor device 40. The surface area of the silicon carbide semiconductor device 40 is a sum of the surface area of the active region 10 and the surface area of the edge termination region 20. Assuming respective lengths of the non-operating regions 80, the $p^+$-type regions 13, and the active region 10 in a direction of view in FIG. 4 is "w" for each, in an instance in which each of the Schottky regions 82 and each of the ohmic regions 81 are provided alternating with one another as depicted in FIG. 4, the area of the non-operating regions 80 is (2×w4)×w. Further, the rate of the surface area of the non-operating regions 80 to the surface area of the $p^+$-type regions 13 is the surface area of the non-operating regions 80/the surface area of the $p^+$-type regions 13 and in the instance depicted in FIG. 4, the surface area of the $p^+$-type regions 13 is w1×w. Further, the rate of the surface area of the non-operating regions 80 to the surface area of the active region 10 is the surface area of the non-operating regions 80/the surface area of the active region 10 and in the instance depicted in FIG. 4, the surface area of the active region 10 is (w1+w5)×w. The calculation formulas above are for an instance in which connected portions between the $p^+$-type regions 13 and the FLR 21 are right angles and in an instance in which the connected portions between the $p^+$-type regions 13 and the FLR 21 are curved shapes, the impact of the curved shapes has to be considered.

Further, as depicted in FIG. 1, the $p^+$-type regions 13 are connected to a guard ring (in FIGS. 1 and 2, the FLR 21) provided in the edge termination region 20. In other words, in the edge termination region 20, the ohmic regions 81 and the non-operating regions 80 are connected to the edge termination region 20. Further, in an instance in which the second nickel silicide film 33*b* is further provided in the guard ring, the first nickel silicide film 33*a* of each of the ohmic regions 81 is connected to the second nickel silicide film 33*b*.

In a conventional configuration in which dot-shaped ohmic electrodes are disposed, in a vicinity of an outer peripheral portion, portions that are far from an ohmic electrode and portions that are close to an ohmic electrode occur, however, in the first embodiment, even in a vicinity of the outer peripheral portion, the ohmic electrodes are uniformly disposed. As a result, when surge current flows, this current may be more uniformly distributed and local concentration may be avoided, whereby IFSM characteristics may be improved. Further, one of the non-operating regions 80 is always between one of the ohmic regions 81 and one of the Schottky regions 82. As a result, the non-operating regions 80 pass carriers through the ohmic regions 81 and thus, leakage current may be reduced.

Further, the non-operating regions 80 are provided around the ohmic regions 81 and in the active region 10, the ohmic regions 81 are apart from one another. In other words, between any adjacent two of the first nickel silicide films 33*a*, one of the non-operating regions 80 and one of the Schottky regions 82 are present. In this manner, in the first embodiment, no wide ohmic region spanning multiple stripe shapes of the ohmic regions 81 is present. As a result, the area of the ohmic regions 81 does not increase and thus, Vf characteristics may be maintained.

Such a structure, for example, as described above, may be formed using a nickel silicide generated by causing the metal film 52 in which nickel, aluminum, and nickel are sequentially deposited and a portion of the surface of the semiconductor substrate 30 to react with each other by a heat treatment. The first nickel silicide film 33*a*, which has a low resistance, is formed by self-alignment by etching and removing portions of the metal film 52 not converted into a silicide (portions excluding heated reaction layer). A p-type ohmic electrode having a low resistance is formed by using the metal film 52 in which nickel, aluminum, and nickel are sequentially stacked. Further, formation is by self-alignment, whereby an ohmic electrode is formed in the JBS structure that has a width of a few μm and Vf characteristics may be maintained. In this manner, the ohmic regions 81 of a low resistance may be formed without reducing the area of the Schottky regions 82 and thus, IFSM characteristics may be improved while maintaining Vf characteristics.

Figure 11:
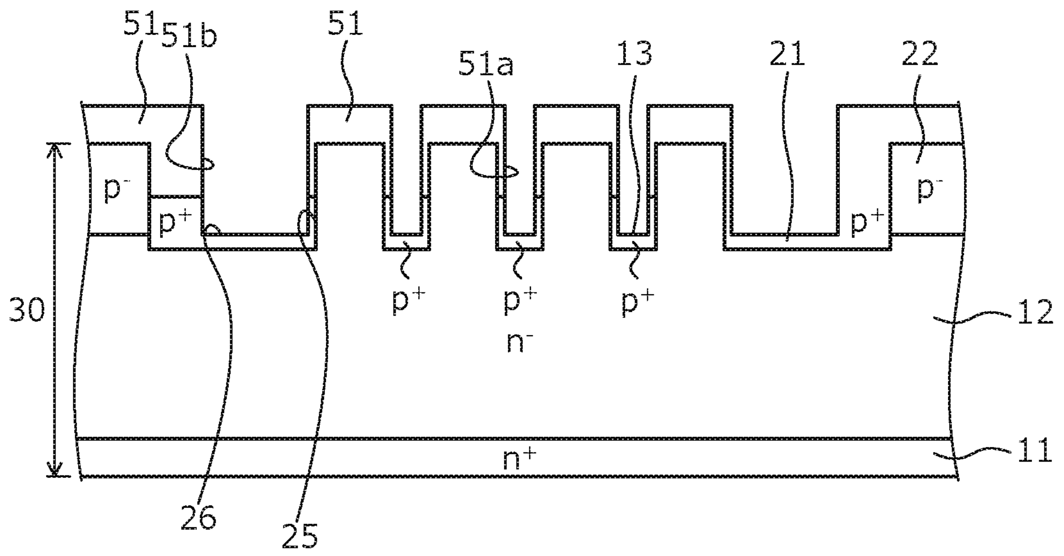
FIG. 11 is a cross-sectional view depicting a state of the silicon carbide semiconductor device according to the first embodiment during manufacture.

Further, the width w2*a* of the first nickel silicide film 33*a* in a direction (second direction) orthogonal to the direction in which the stripe-shaped non-operating regions 80, the stripe-shaped ohmic regions 81, and the stripe-shaped Schottky regions 82 each extend is narrower than a width w1 of each of the $p^+$-type regions 13 and a width w4 of the non-operating regions 80 is in a range of 0.1 μm to 1.0 μm, thereby, enabling a design margin for enhancing positioning accuracy of a mask (remaining portion of a later-described oxide film 51: refer to FIG. 11) used when the first nickel silicide film 33*a* is formed. As a result, the first nickel silicide films 33*a* may be accurately disposed at positions, respectively, facing the $p^+$-type regions 13 in the depth direction.

The second nickel silicide film 33*b* is an ohmic electrode in ohmic contact with the FLR 21. The second nickel silicide film 33*b* is provided at sidewalls and a bottom of a third trench 27 provided in the FLR 21, in the connecting region 20*a* of the edge termination region 20. The second nickel silicide film 33*b* is apart from the field oxide film 15, at sidewalls of the field oxide film 15. The second nickel silicide film 33*b*, similarly to the first nickel silicide films 33*a*, increases the amount of surge current drawn out and has a function of enhancing the surge current withstanding capability.

As depicted in FIG. 1, the third trench 27, at a sidewall thereof facing the active region 10, is in contact with the front electrode 14. Thus, similarly to the first trenches 25, the area of the SBD structure configured by the Schottky junction may be increased. Further, the second nickel silicide film 33*b*, at a side thereof facing the active region 10, may have one of the non-operating regions 80, which is in contact with the front electrode 14.

The second nickel silicide film 33*b*, as described above, is formed at a portion where the FLR 21 and the metal film 52 that is deposited on the front surface of the semiconductor substrate 30 contact each other, by causing the semiconductor substrate 30 and the metal film 52 to react with each other by a heat treatment.

A portion of the front surface of the semiconductor substrate 30, excluding the portion in contact with the front electrode 14, is covered by the field oxide film 15. At an uppermost surface of the front surface of the semiconductor substrate 30, the passivation film (not depicted) containing a polyimide is provided. Here, at an upper portion of the $n^+$-type channel stopper region, a channel stopper electrode that is in contact with and electrically connected to the $n^+$-type channel stopper region may be provided. The channel stopper electrode, for example, may be an aluminum alloy film formed concurrently with the aluminum alloy film 32. In an entire area of the back surface (back surface of the $n^+$-type starting substrate 11) of the semiconductor substrate 30, a back electrode (second electrode) 19 is provided electrically connected to the $n^+$-type starting substrate 11.

Figure 5:
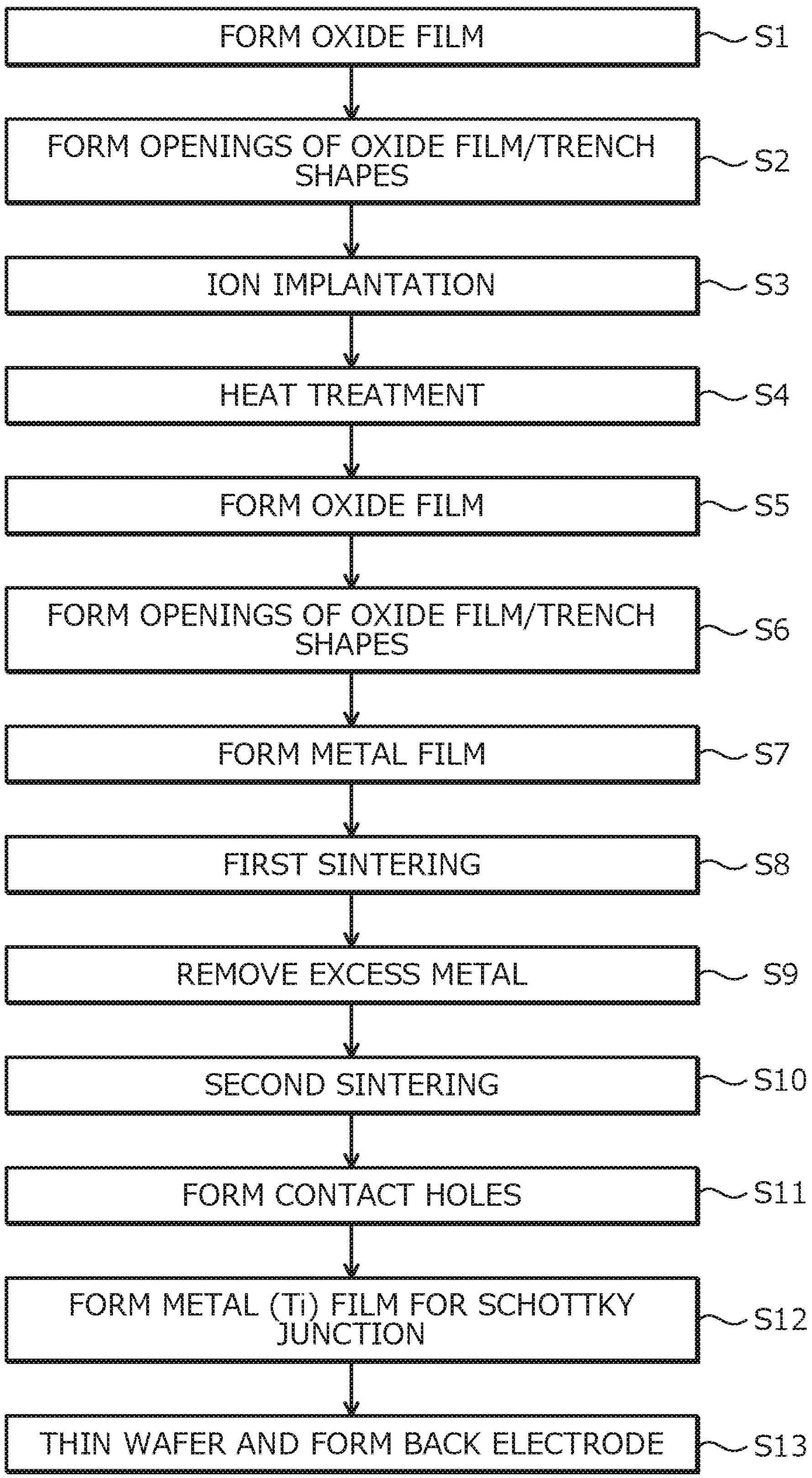
FIG. 5 is a flowchart depicting an outline of a method of manufacturing the silicon carbide semiconductor device according to the first embodiment.

Next, a method of manufacturing the silicon carbide semiconductor device 40 according to the first embodiment is described. FIG. 5 is a flowchart depicting an outline of the method of manufacturing the silicon carbide semiconductor device according to the first embodiment. FIGS. 6, 7, 8, 9, 10, 11, 12, 13, 14, 15, and 16 are cross-sectional views of states of the silicon carbide semiconductor device according to the first embodiment during manufacture.

Figure 6:
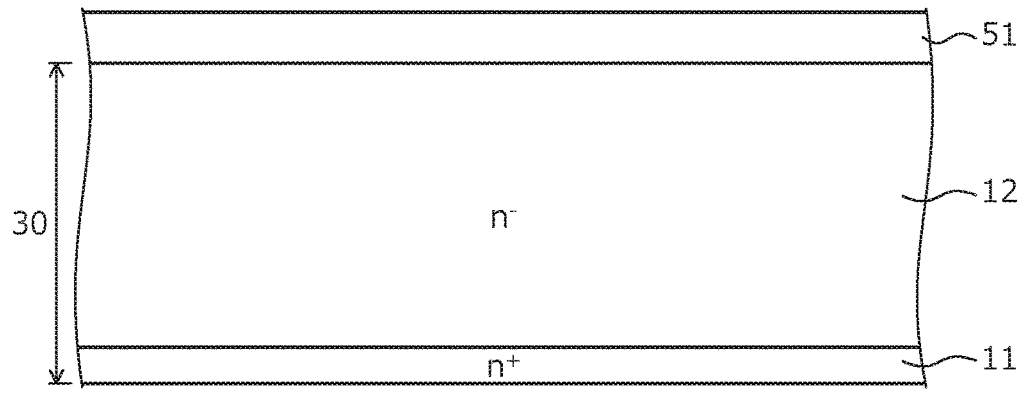
FIG. 6 is a cross-sectional view depicting a state of the silicon carbide semiconductor device according to the first embodiment during manufacture.

First, as depicted in FIG. 6, a four-layer periodic hexagonal crystal silicon carbide (4H—SiC) substrate doped with nitrogen (N) at a concentration of, for example, about $5\times10^{18}/cm^3$ is prepared as the $n^+$-type starting substrate (semiconductor wafer) 11. The front surface of the $n^+$-type starting substrate 11, for example, may have an off-angle of about 4 degrees with respect to a (0001) plane. Next, the $n^-$-type epitaxial layer doped with nitrogen at a concentration of, for example, about $1.8\times10^{16}/cm^3$ and constituting the $n^-$-type drift region 12 is grown on the front surface of the $n^+$-type starting substrate 11 (first process).

A thickness of the $n^+$-type starting substrate 11 constituting the $n^+$-type cathode region may be, for example, about 350 μm. A thickness of the $n^-$-type epitaxial layer constituting the $n^-$-type drift region 12 may be, for example, about 6 μm. By the processes up to here, the semiconductor substrate (semiconductor wafer) 30 in which the $n^-$-type epitaxial layer that constitutes the $n^-$-type drift region 12 is stacked on the front surface of the $n^+$-type starting substrate 11 is fabricated. Next, for example, the oxide film 51 is formed in an entire area of the front surface of the semiconductor substrate 30, as a trench forming mask (step S1). As described above, the semiconductor substrate 30 has, as the front surface, a main surface that has the $n^-$-type drift region 12 and, as the back surface, a main surface that has the $n^+$-type starting substrate 11.

Figure 7:
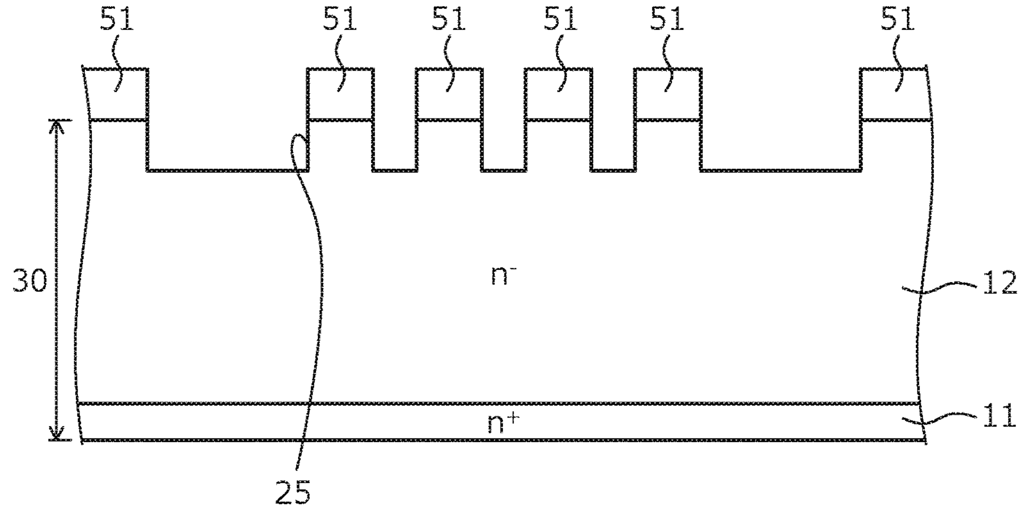
FIG. 7 is a cross-sectional view depicting a state of the silicon carbide semiconductor device according to the first embodiment during manufacture.

Next, as depicted in FIG. 7, the oxide film 51 is selectively removed by photolithography and etching, thereby forming openings, and the first trenches 25 are selectively formed from the surface of the $n^-$-type drift region 12 by dry etching and do not reach the $n^+$-type starting substrate 11 (step S2: second process).

Figure 8:
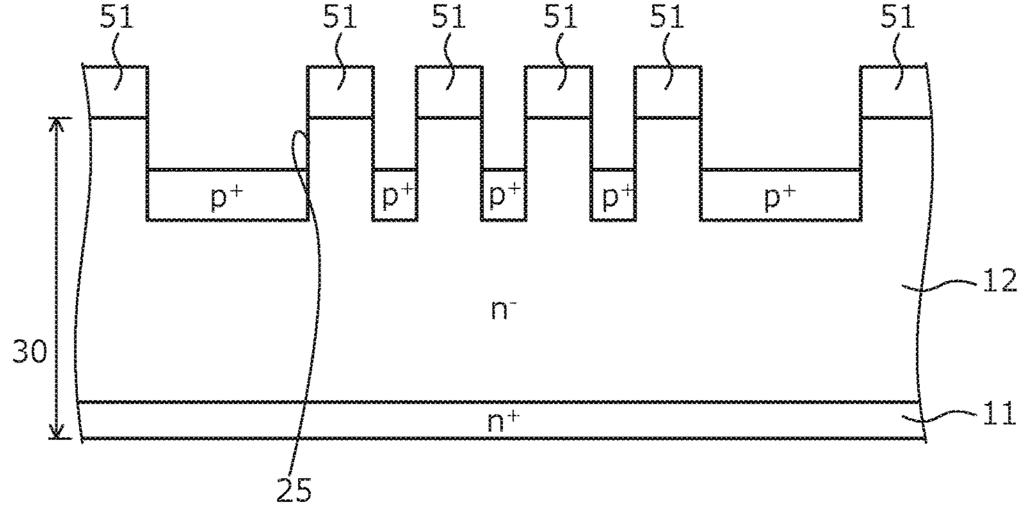
FIG. 8 is a cross-sectional view depicting a state of the silicon carbide semiconductor device according to the first embodiment during manufacture.
Figure 9:
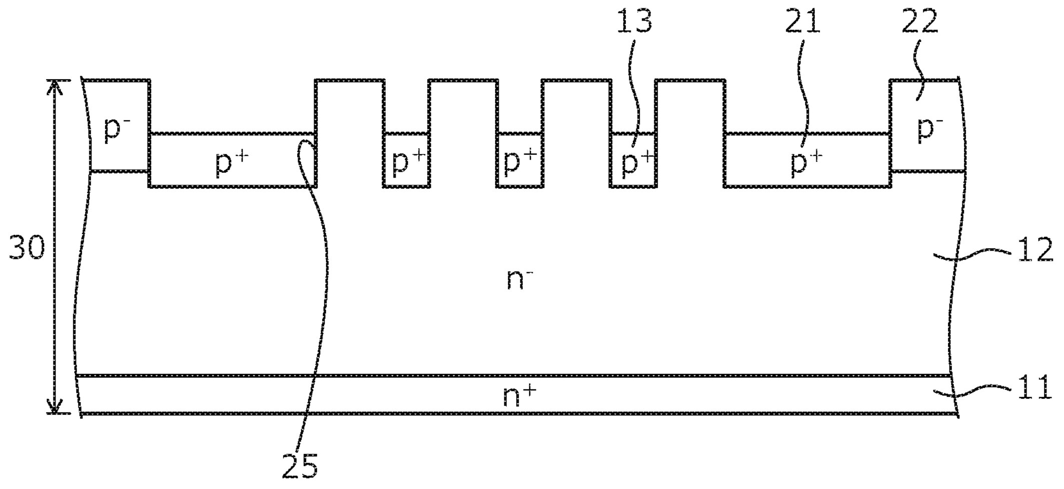
FIG. 9 is a cross-sectional view depicting a state of the silicon carbide semiconductor device according to the first embodiment during manufacture.

Next, as depicted in FIG. 8, in the active region 10, a p-type impurity such as aluminum is implanted in the bottoms of the first trenches 25 by ion implantation (step S3). Similarly, a p-type impurity such as aluminum is implanted in a portion corresponding to the $p^-$-type region 22, and an n-type impurity such as nitrogen is implanted in a portion corresponding to the $n^+$-type channel stopper region. Next, as depicted in FIG. 9, the ion-implanted impurities are activated by a heat treatment (step S4: third process, fourth process). As a result, at the bottoms of the first trenches 25, one or more of the $p^+$-type regions 13 configuring the JBS structure, the FLR 21, the $p^-$-type region 22, and the $n^+$-type channel stopper region (not depicted) are each selectively formed. Next, the oxide film 51 is removed.

Figure 10:
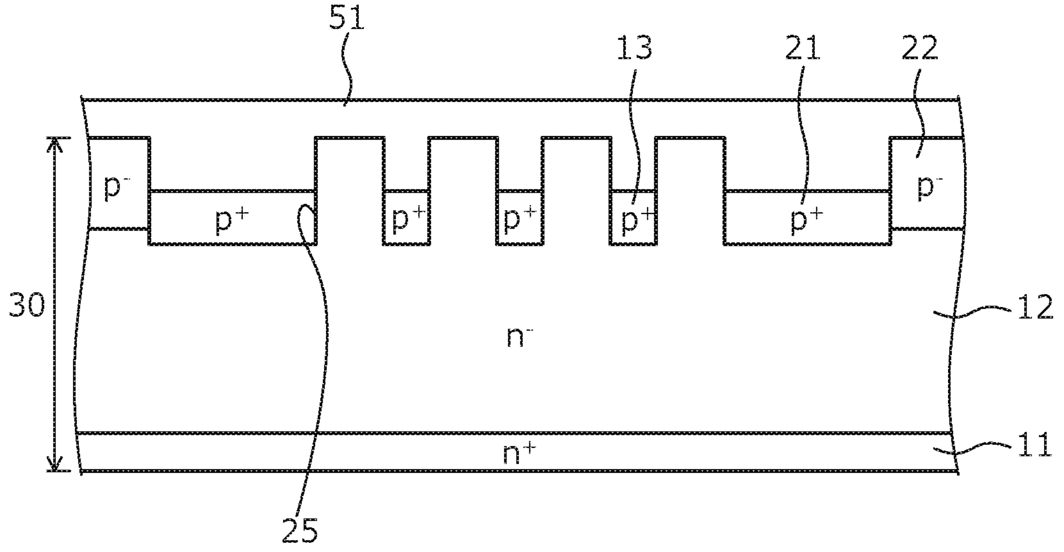
FIG. 10 is a cross-sectional view depicting a state of the silicon carbide semiconductor device according to the first embodiment during manufacture.

Next, as depicted in FIG. 10, for example, the oxide film 51 is formed as a trench forming mask at the front surface of the semiconductor substrate 30 (step S5: fifth process). Next, as depicted in FIG. 11, the oxide film 51 is selectively removed by photolithography and etching, thereby forming the openings 51*a*, 51*b*, and the second trenches 26 are selectively formed from the surfaces of the $p^+$-type regions 13 and the FLR 21 by dry etching and do not reach the $n^-$-type drift region 12 (step S6: sixth process, fourteenth process).

Figure 12:
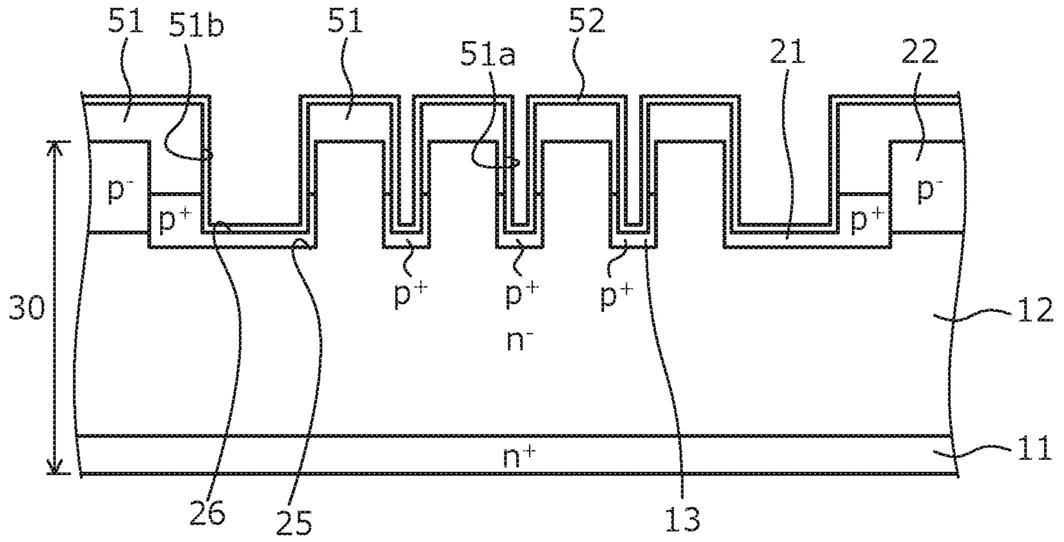
FIG. 12 is a cross-sectional view depicting a state of the silicon carbide semiconductor device according to the first embodiment during manufacture.

Next, as depicted in FIG. 12, for example, the metal film 52 is formed spanning portions of the front surface (surface) of the semiconductor substrate 30, in the openings 51*a*, 51*b* of the oxide film 51 by a sputtering technique from the surface of the oxide film 51 (step S7: seventh process). The metal film 52 is a stacked metal film in which a first nickel film, an aluminum film (metal film containing aluminum), and a second nickel film are sequentially stacked. In FIG. 12, the first nickel film, the aluminum film, and the second nickel film are collectively depicted as a single layer in the metal film 52. In the description hereinafter, while the metal film 52 having the three-layered structure is described, the metal film 52 may be two-layer stacked metal film in which the aluminum film and the second nickel film are sequentially stacked. As for the metal film 52, preferably, a combined thickness of the first nickel film, the aluminum film, and the second nickel film, or a combined thickness of the aluminum film and the second nickel film may be in a range of 50 nm to 250 nm.

Figure 13:
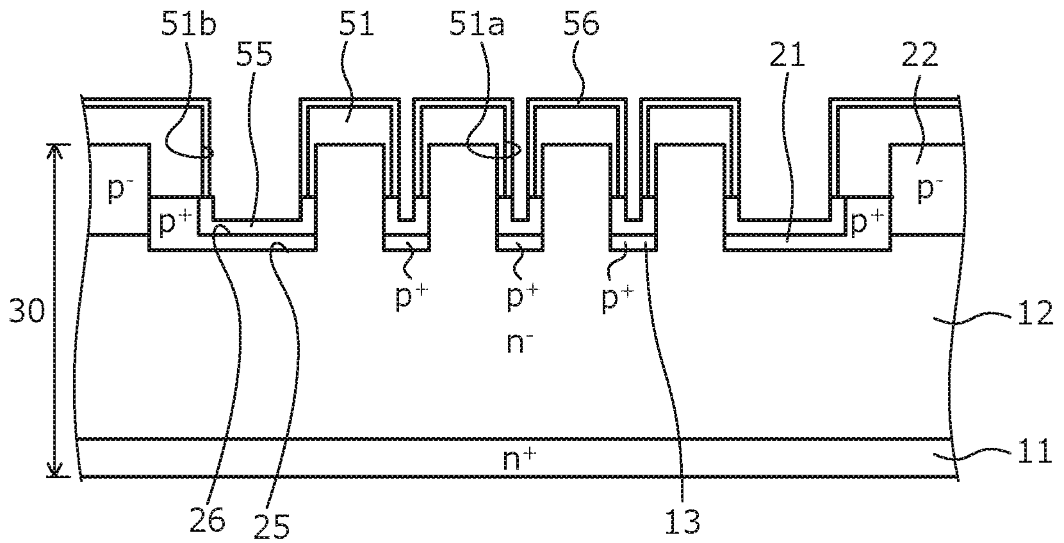
FIG. 13 is a cross-sectional view depicting a state of the silicon carbide semiconductor device according to the first embodiment during manufacture.

Next, as depicted in FIG. 13, a first sintering is performed to the metal film 52 by a heat treatment (step S8: eighth process), whereby an aluminum-nickel-silicon (Al—Ni—Si) compound 55 is formed in the openings 51*a*, 51*b* of the oxide film 51. By thermal diffusion of aluminum atoms into the first nickel film, thermal diffusion of nickel atoms into the semiconductor substrate 30, and thermal diffusion of silicon atoms into the first nickel film and into the aluminum film, the Al—Ni—Si compound 55 is formed at locations where the metal film 52 and the semiconductor substrate 30 are in contact with each other. The Al—Ni—Si compound 55 forms a low-resistance ohmic junction with the high impurity concentration in the FLR 21 or the $p^+$-type regions 13.

Figure 14:
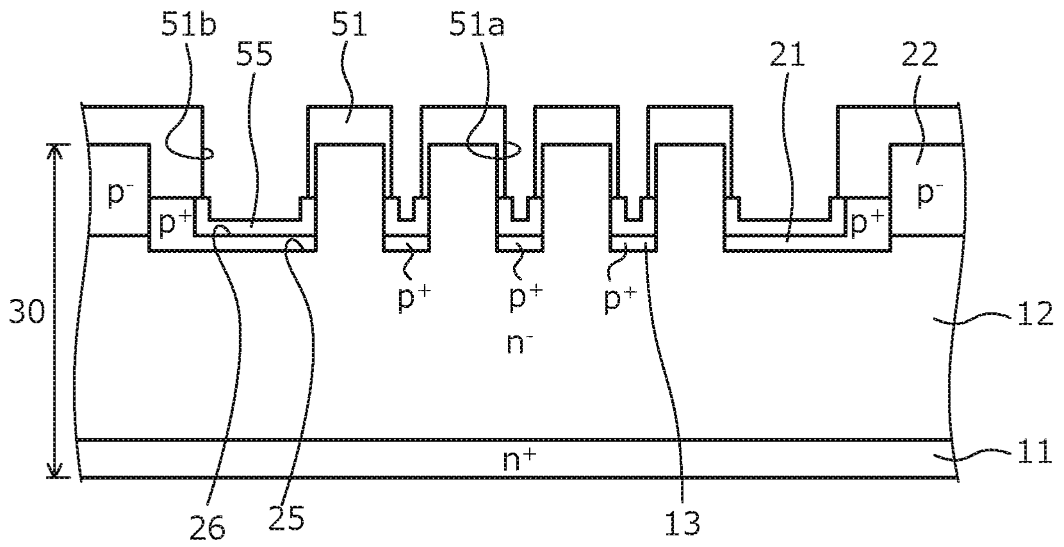
FIG. 14 is a cross-sectional view depicting a state of the silicon carbide semiconductor device according to the first embodiment during manufacture.

Next, as depicted in FIG. 14, excess metal (excess portions) on the oxide film 51 and in the openings 51*a*, 51*b* of the oxide film 51 is removed (step S9: nineth process). The excess metal is generated from portions of the metal film 52 left unreacted and the metal film 52 and is metal other than the Al—Ni—Si compound 55 and in particular, is an aluminum-nickel compound 56 not contributing to the generation of the Al—Ni—Si compound 55 (refer to FIG. 13).

Next, a second sintering is performed to the Al—Ni—Si compound 55 by a heat treatment (step S10: tenth process). Due to the heat treatment at step S10, a nickel silicide is generated in the Al—Ni—Si compound 55 and the Al—Ni—Si compound 55 is used to make the nickel silicide films 33 that are in ohmic contact with the semiconductor substrate 30. As a result, the nickel silicide films 33 that are in ohmic contact with the semiconductor substrate 30 are formed in the openings 51*a*, 51*b* of the oxide film 51, by self-alignment using the oxide film 51 as a mask. A thickness of each of the nickel silicide films 33 is in a range of 100 nm to 500 nm and about two times a thickness of the metal film 52.

Figure 15:
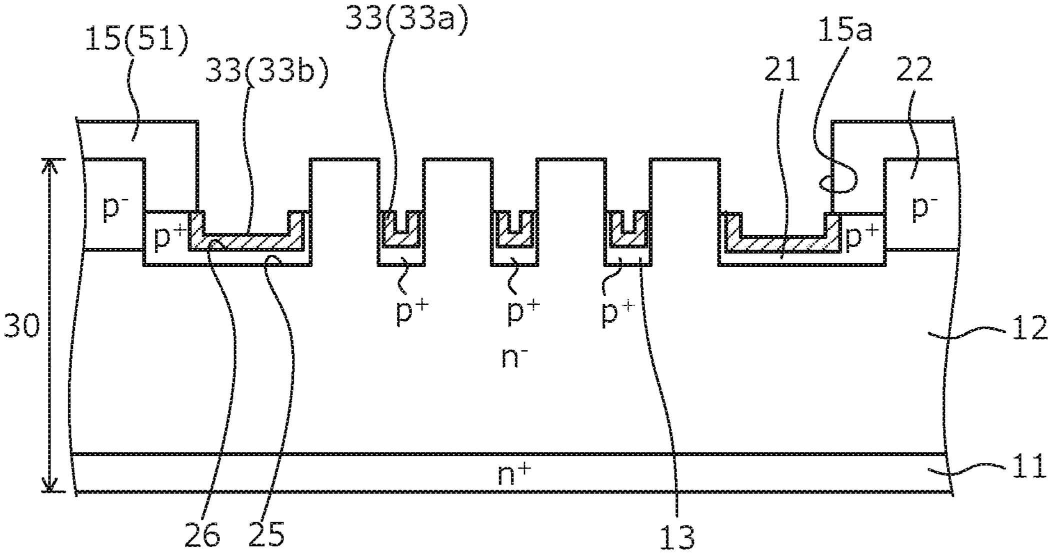
FIG. 15 is a cross-sectional view depicting a state of the silicon carbide semiconductor device according to the first embodiment during manufacture.

Next, as depicted in FIG. 15, by photolithography, a resist film (not depicted) having an opening that corresponds to a formation region of the contact hole 15*a* of the field oxide film 15 is formed. Next, a portion of the oxide film 51 in an active-region center portion is etched using the resist film as a mask, whereby the contact hole 15*a* that penetrates through the field oxide film 15 in the depth direction is formed (step S11: eleventh process). In the process at step S11, only a portion of the oxide film 51 constituting the field oxide film 15 is left.

Figure 16:
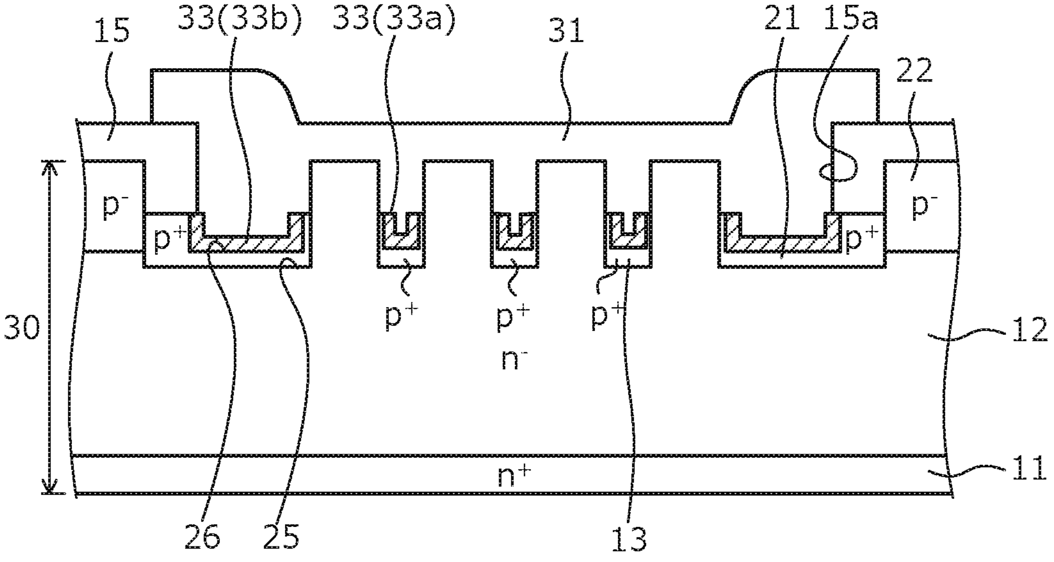
FIG. 16 is a cross-sectional view depicting a state of the silicon carbide semiconductor device according to the first embodiment during manufacture.

Next, as depicted in FIG. 16, for example, by a physical vapor deposition (PVD) such as sputtering, the titanium film 31 is formed in an entire area, from the surface of the field oxide film 15 to the front surface of the semiconductor substrate 30, in the contact hole 15*a*. Next, by photolithography and etching, the titanium film 31 is left only in the contact hole 15*a* (step S12). A thickness of the titanium film 31 may be, for example, about 100 nm. The titanium film 31 may extend from inside the contact hole 15*a*, onto the field oxide film 15.

Next, for example, sintering is performed to the titanium film 31 by a heat treatment for about 10 minutes at a temperature of about 500 degrees C. The Schottky junctions between the titanium film 31 and the $n^-$-type drift region 12 are formed by the heat treatment. Next, an aluminum alloy film having, for example, a thickness of about 5 μm is formed, for example, by physical vapor deposition such as sputtering, in an entire area from the surface of the titanium film 31 to the surface of the field oxide film 15. Next, the aluminum alloy film is selectively removed by photolithography and etching, thereby leaving a portion of the aluminum alloy film, as the aluminum alloy film 32 that constitutes the front electrode 14, on the surface of the titanium film 31 (twelfth process).

Next, the front surface of the semiconductor substrate 30 (semiconductor wafer) is covered by a protective film (not depicted) and thereafter, the semiconductor substrate 30 is polished from the back surface, whereby the thickness of the semiconductor substrate 30 is reduced to a product thickness. Next, for example, nickel, titanium, etc. is deposited in an entire area of the back surface (back surface of the $n^+$-type starting substrate 11) of the semiconductor substrate 30 by physical vapor deposition such as sputtering and thereafter, the back electrode 19 is formed by laser annealing (step S13: thirteenth process). Subsequently, the protective film covering the front surface of the semiconductor substrate 30 is removed and thereafter, the semiconductor substrate 30 is diced (cut) into individual chips, whereby the silicon carbide semiconductor device 40 depicted in FIG. 1 is completed.

As described above, according to the first embodiment, the fine ohmic striped structure is provided in the JBS striped structure, thereby forming the two-step trench structure. As a result, the area of the SBD structure configured by the Schottky junctions is increased, the on-voltage increases, and Vf may be reduced. Furthermore, the surface area of the first nickel silicide film 33*a* may be increased and the flow of current to the $p^+$-type regions during surges is facilitated, whereby the surge current withstanding capability (IFSM) may be ensured. Thus, the characteristics of both the surge current withstanding capability and the on-voltage may be improved.

Figure 17:
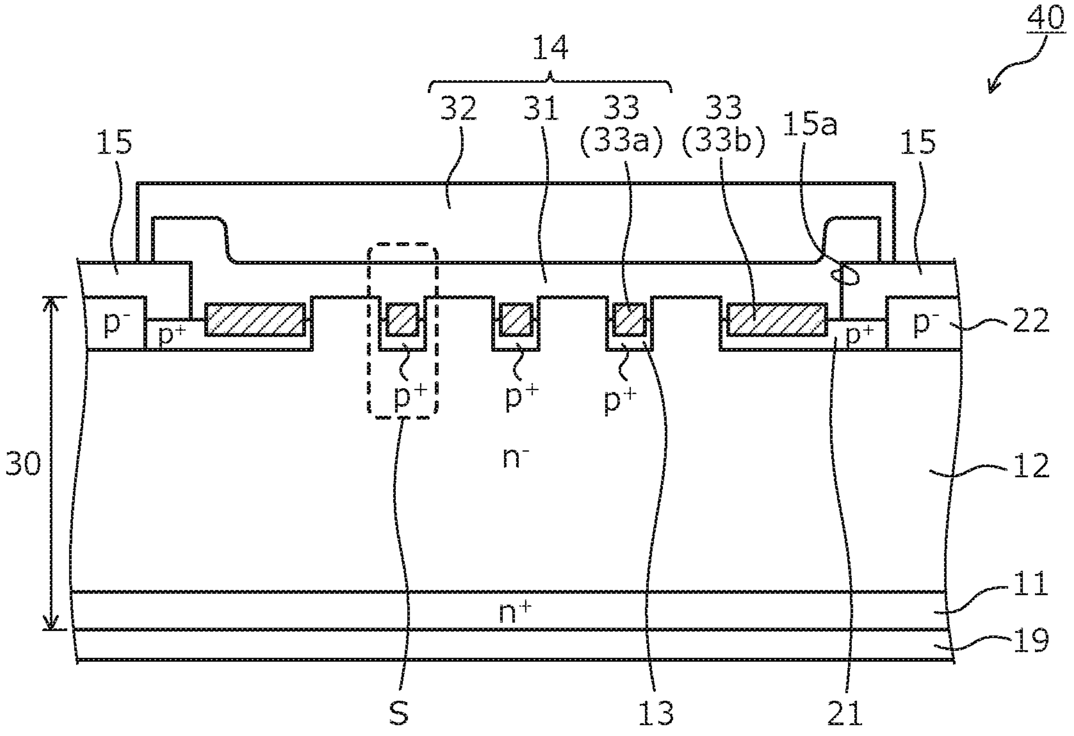
FIG. 17 is a cross-sectional view depicting a structure of the silicon carbide semiconductor device according to a second embodiment.

Next, a structure of the silicon carbide semiconductor device according to a second embodiment is described. FIG. 17 is a cross-sectional view depicting the structure of the silicon carbide semiconductor device according to the second embodiment. A plan view of a layout when viewed from the front side of the silicon carbide semiconductor device according to the second embodiment is the same as that for the first embodiment and thus, is not depicted (refer to FIG. 2).

The silicon carbide semiconductor device 40 according to the second embodiment differs from the silicon carbide semiconductor device 40 according to the first embodiment in that the shape of the nickel silicide film 33 of the region S surrounded by the dashed line is different. Thus, other parts of the structure of the silicon carbide semiconductor device 40 according to the second embodiment are not further described hereinafter.

Figure 18:
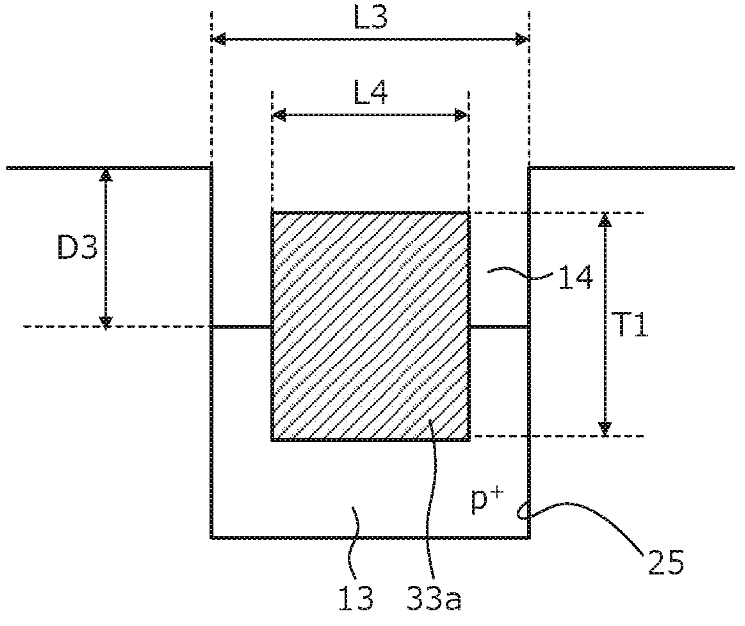
FIG. 18 is a detailed cross-sectional view depicting the structure of the region S surrounded by the dashed line in FIG. 17.

FIG. 18 is a detailed cross-sectional view depicting the structure of the region S surrounded by the dashed line in FIG. 17. As depicted in FIG. 18, the fine ohmic striped structure is provided in the JBS striped structure, thereby forming the trench structure. The $p^+$-type regions 13 are provided at the bottoms of the first trenches 25. For example, preferably, a width L3 of each of the first trenches 25 may be in a range of 0.7 μm to 3 μm and a depth D3 of the first trenches 25 may be in a range of 100 nm to 1000 nm.

Portions of the front electrode 14 embedded in the first trenches 25 are in contact with the sidewalls of the first trenches 25. Thus, the area of the SBD structure configured by the Schottky junctions between portions of the front electrode 14 and the $n^-$-type drift region 12 is increased, the on-voltage increases, and Vf may be reduced.

The first nickel silicide films 33*a* respectively at the bottoms of the first trenches 25 are provided at the surfaces of the $p^+$-type regions 13, respectively. Further, the bottom surfaces of the first nickel silicide films 33*a* are positioned deeper than are the interfaces between the front electrode 14 and the $p^+$-type regions 13. Further, the front surfaces (surfaces opposite to the bottom surfaces facing the $n^+$-type starting substrate 11) of the first nickel silicide film 33*a* are positioned shallower than are the interfaces between the front electrode 14 and the $p^+$-type regions 13. More specifically, each front surface (surface opposite to the bottom surface facing the $n^+$-type starting substrate 11) of the first nickel silicide film 33*a* is a top of the first nickel silicide film 33*a* that is a portion of the first nickel silicide film 33*a* farthest from the $n^+$-type starting substrate 11 than the rest of portions of the first nickel silicide film 33*a* in the ohmic region 81 is positioned farther from the $n^+$-type starting substrate 11 than is the interface between the front electrode 14 and the $p^+$-type regions 13 in each of the non-operating regions 80. Furthermore, in the second embodiment, the first nickel silicide film 33*a* is thicker than conventionally. For example, preferably, a width L4 of the first nickel silicide film 33*a* may be in a range of 0.5 μm to 2.8 μm and a thickness T1 of the first nickel silicide film 33*a* may be in a range of 100 nm to 1000 nm.

The first nickel silicide film 33*a* is thinner than conventionally and thus, the surface area of the first nickel silicide film 33*a* may be increased and the flow of current to the $p^+$-type regions 13 is facilitated during surges, whereby surge current withstanding capability (IFSM) may be ensured. With the described structure, both the surge current withstanding capability and the on-voltage characteristics may be improved.

Figure 19:
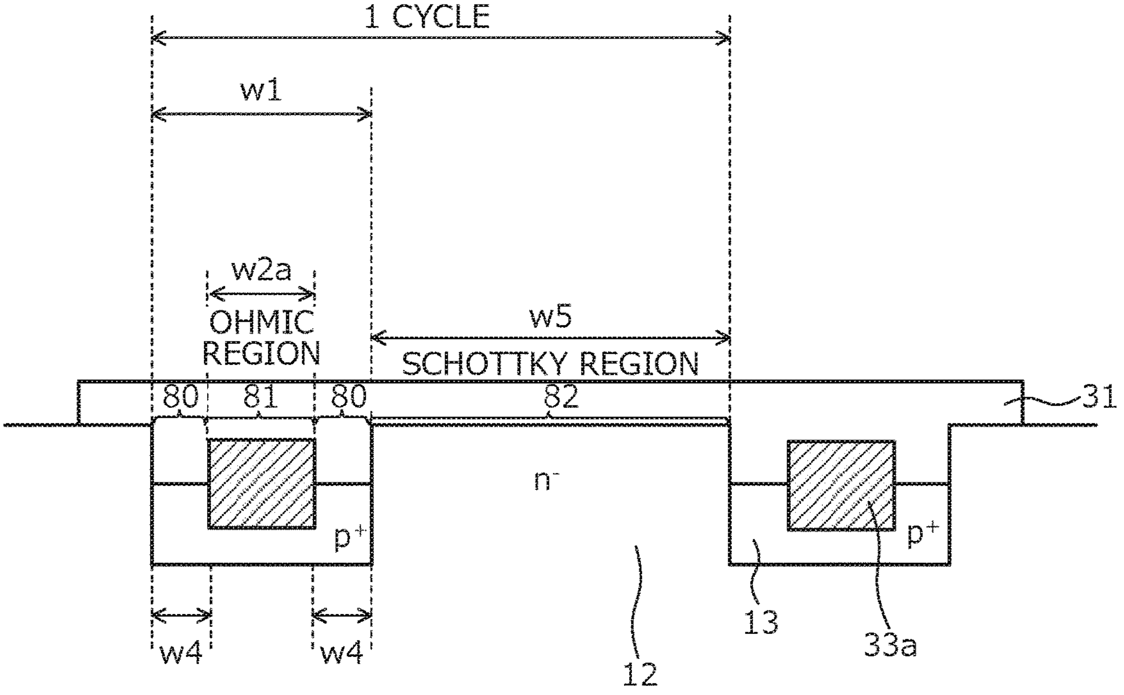
FIG. 19 is a cross-sectional view depicting the ohmic regions, the non-operating regions, and the Schottky regions of the silicon carbide semiconductor device according to the second embodiment.

FIG. 19 is a cross-sectional view depicting the ohmic regions, the non-operating regions, and the Schottky regions of the silicon carbide semiconductor device according to the second embodiment. In the second embodiment as well, the active region 10 is configured by the non-operating regions 80 each having a striped shape and in which the titanium film 31 is in contact with the $p^+$-type regions 13 configuring the JBS structure, the ohmic regions 81 each having a striped shape in which the titanium film 31 is in contact with the first nickel silicide film 33*a*, and the Schottky regions 82 each having a striped shape in which the titanium film 31 is in contact with the $n^-$-type drift region 12. In this manner, in the active region 10, four regions including one of the ohmic regions 81, the two non-operating regions 80 surrounding said one of the ohmic regions 81, and one of the Schottky regions 82 constitute one repeating cycle.

This cyclic structure enables the ohmic regions 81 to be disposed densely and uniformly in an entire area of the active region 10. Thus, when large surge current flows in the forward direction in the semiconductor substrate, the surge current may be distributed and IFSM characteristics may be increased.

Further, in the second embodiment as well, preferably, the amount of the surface area of the non-operating regions 80 may be in a range of 5% to 35% of the amount of the surface area of the silicon carbide semiconductor device 40. Further, preferably, the amount of the surface area of the non-operating regions 80 may be in a range of 35% to 90% of the amount of the surface area of the $p^+$-type regions 13. Further, preferably, the amount of the surface area of the non-operating regions 80 in the active region 10 may be in a range of 15% to 40%. The rates of the surface areas are within these ranges, whereby both enhancement of the surge current withstanding capability and low Vf characteristics may be achieved.

Figure 20:
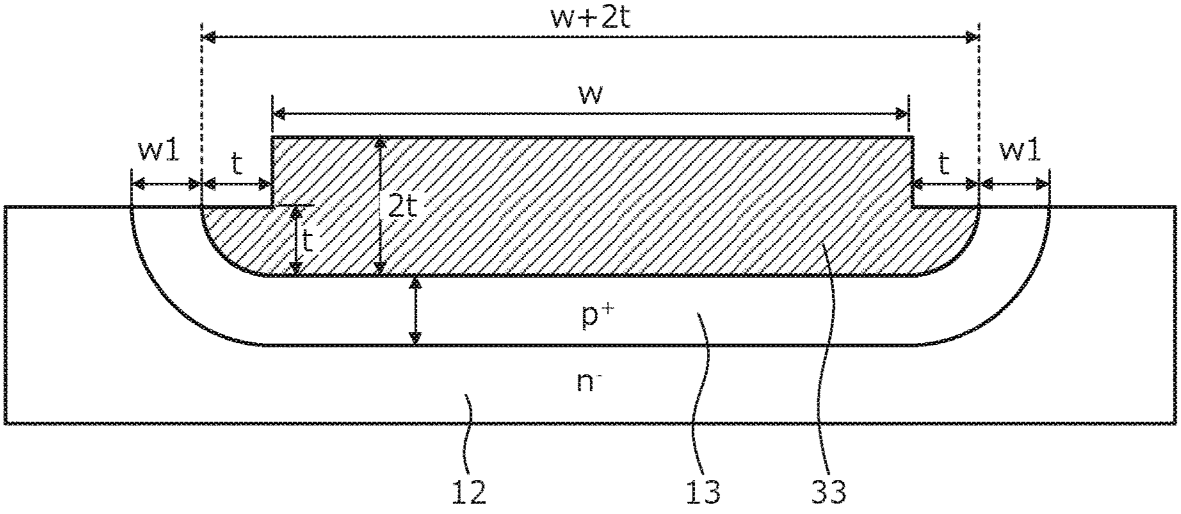
FIG. 20 is a detailed cross-sectional view depicting a structure of a nickel silicide film of the silicon carbide semiconductor device according to the second embodiment.

Here, FIG. 20 is a detailed cross-sectional view depicting the structure of the nickel silicide film of the silicon carbide semiconductor device according to the second embodiment. As depicted in FIG. 20, preferably, the nickel silicide film 33 may protrude about half (½) of "t" of a thickness 2t from the surfaces of the $p^+$-type regions 13. Further, preferably, in the $p^+$-type regions 13, the nickel silicide film 33 may extend about half of "t" of the thickness 2t on both sides thereof. Thus, at both sides of the nickel silicide film 33, the width w1 of the $p^+$-type regions 13 exposed at the surface of the $n^-$-type drift region 12 is about 0.5 μm. Further, the width of each of the nickel silicide films 33 at the surface of each of the $p^+$-type regions 13 is greater than the width of the portion of each of the nickel silicide films 33 protruding from the surfaces of the $p^+$-type regions 13.

The nickel silicide films 33 may also be adjusted in thickness during sputtering of the nickel film and may be thicker than the nickel film, thereby, enabling the thickness of the nickel silicide films 33 to be increased. For example, the thickness of each of the nickel silicide films 33 is about two times that of the metal film 52 configured by the first nickel film, the aluminum film, and the second nickel film.

Next, a method of manufacturing the silicon carbide semiconductor device 40 according to the second embodiment. A flowchart depicting an outline of the method of manufacturing the silicon carbide semiconductor device according to the second embodiment is a same as that of the first embodiment and thus, is not depicted (refer to FIG. 5). FIGS. 21, 22, 23, 24, 25, and 26 are cross-sectional views depicting states of the silicon carbide semiconductor device according to the second embodiment during manufacture. Here, states similar to those of the first embodiment are not depicted.

First, similarly to the first embodiment, the $n^+$-type starting substrate (semiconductor wafer) 11 is prepared, the $n^-$-type epitaxial layer is grown (the first process), thereby, fabricating the semiconductor substrate (semiconductor wafer) 30. Next, in an entire area of the front surface of the semiconductor substrate 30, the trench forming mask is formed using, for example, the oxide film 51 (step S1). Thereafter, similarly to the first embodiment, the processes from selectively forming the first trenches 25 (step S2: the second process) to the process of forming the trench forming mask at the front surface of the semiconductor substrate 30, using, for example, the oxide film 51 (step S5: the fifth process) are performed (refer to FIGS. 6 to 10).

Figure 21:
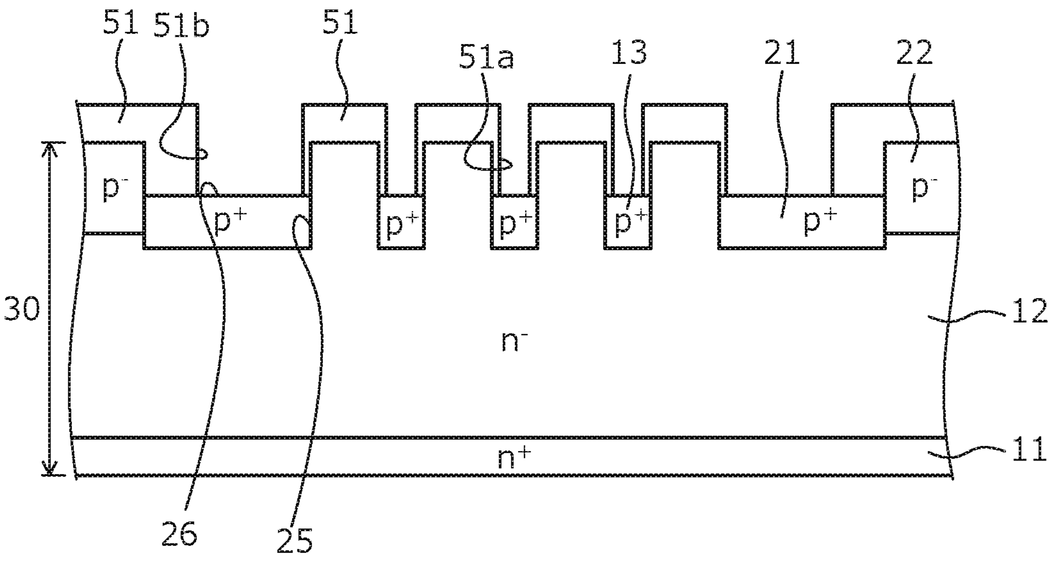
FIG. 21 is a cross-sectional view a depicting state of the silicon carbide semiconductor device according to the second embodiment during manufacture.

Next, as depicted in FIG. 21, the oxide film 51 is selectively removed by photolithography and etching, thereby forming the openings 51*a*, 51*b* and the second trenches 26 that reach the surfaces of the $p^+$-type regions 13 and the FLR 21 are selectively formed by dry etching (step S6: the sixth process).

Figure 22:
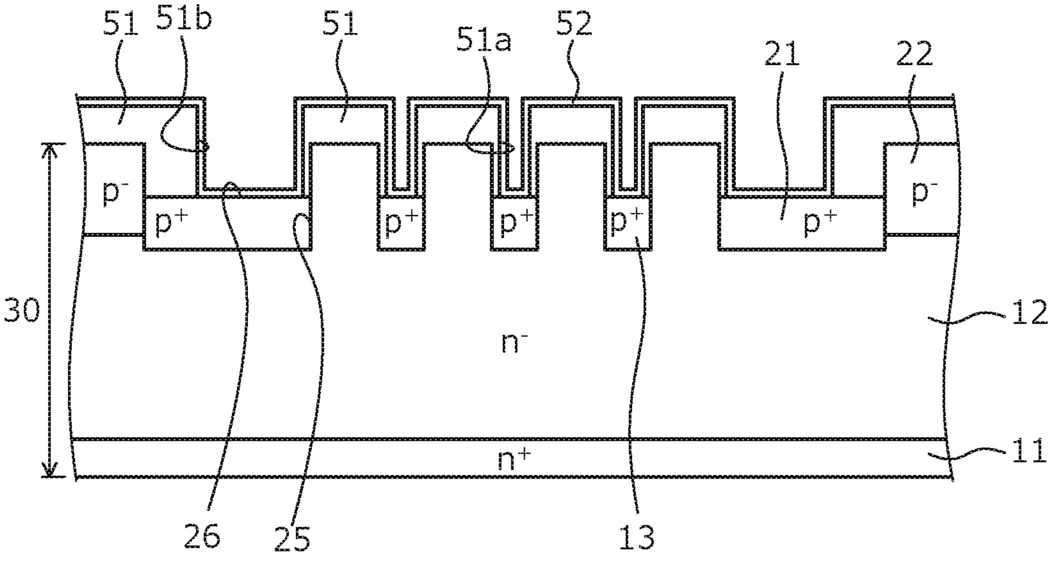
FIG. 22 is a cross-sectional view a depicting state of the silicon carbide semiconductor device according to the second embodiment during manufacture.

Next, as depicted in FIG. 22, for example, the metal film 52 is formed spanning portions of the front surface (surface) of the semiconductor substrate 30, in the openings 51*a*, 51*b* of the oxide film 51 by a sputtering technique from the surface of the oxide film 51 (step S7: the seventh process). The metal film 52 is a stacked metal film in which the first nickel film, the aluminum film (metal film containing aluminum), and the second nickel film are sequentially stacked. In FIG. 22, the first nickel film, the aluminum film, and the second nickel film are collectively depicted as a single layer in the metal film 52. In the description hereinafter, while the metal film 52 having the three-layered structure is described, the metal film 52 may be a two-layered stacked metal film in which the aluminum film and the second nickel film ae sequentially stacked. As for the metal film 52, preferably a combined thickness of the first nickel film, the aluminum film, and the second nickel film, or a combined thickness of the aluminum film and the second nickel film may be in a range of 250 nm to 500 nm.

Figure 23:
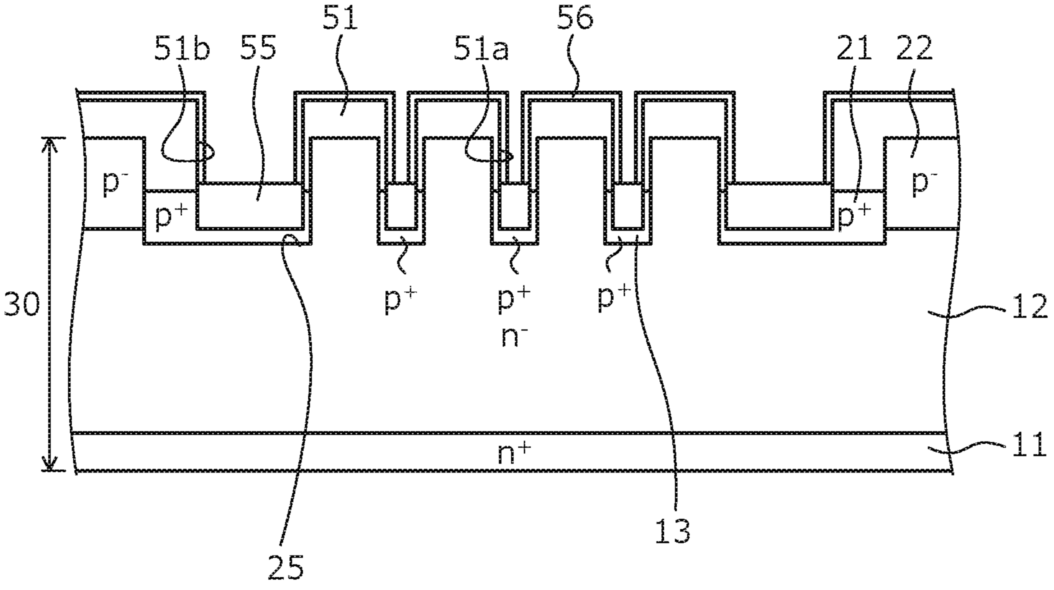
FIG. 23 is a cross-sectional view a depicting state of the silicon carbide semiconductor device according to the second embodiment during manufacture.

Next, as depicted in FIG. 23, the first sintering is performed to the metal film 52 by a heat treatment (step S8: the eighth process), whereby the aluminum-nickel-silicon (Al—Ni—Si) compound 55 is formed in the openings 51*a*, 51*b* of the oxide film 51. By thermal diffusion of aluminum atoms into the first nickel film, thermal diffusion of nickel atoms into the semiconductor substrate 30, and thermal diffusion of silicon atoms into the first nickel film and into the aluminum film, the Al—Ni—Si compound 55 is formed at locations where the metal film 52 and the semiconductor substrate 30 are in contact with each other. The Al—Ni—Si compound 55 forms a low-resistance ohmic junction with the high impurity concentration in the FLR 21 or the $p^+$-type regions 13.

Figure 24:
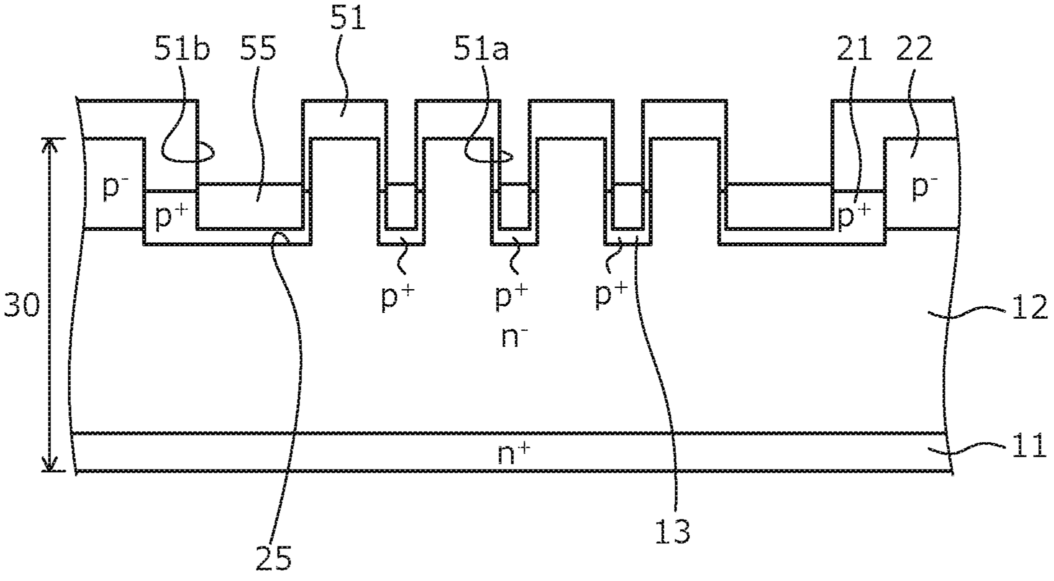
FIG. 24 is a cross-sectional view a depicting state of the silicon carbide semiconductor device according to the second embodiment during manufacture.

Next, as depicted in FIG. 24, excess metal (excess portions) on the oxide film 51 and in the openings 51*a*, 51*b* of the oxide film 51 is removed (step S9: the nineth process). The excess metal is generated from portions of the metal film 52 left unreacted and the metal film 52 and is metal other than the Al—Ni—Si compound 55 and in particular, is the aluminum-nickel compound 56 not contributing to the generation of the Al—Ni—Si compound 55 (refer to FIG. 23).

Next, the second sintering is performed to the Al—Ni—Si compound 55 by a heat treatment (step S10: the tenth process). Due to the heat treatment at step S10, a nickel silicide is generated in the Al—Ni—Si compound 55 and the Al—Ni—Si compound 55 is used to make the nickel silicide films 33 that are in ohmic contact with the semiconductor substrate 30. As a result, the nickel silicide films 33 that are in ohmic contact with the semiconductor substrate 30 are formed in the openings 51*a*, 51*b* of the oxide film 51, by self-alignment using the oxide film 51 as a mask. The thickness of each of the nickel silicide films 33 is in a range of 100 nm to 500 nm and about two times a thickness of the metal film 52.

Figure 25:
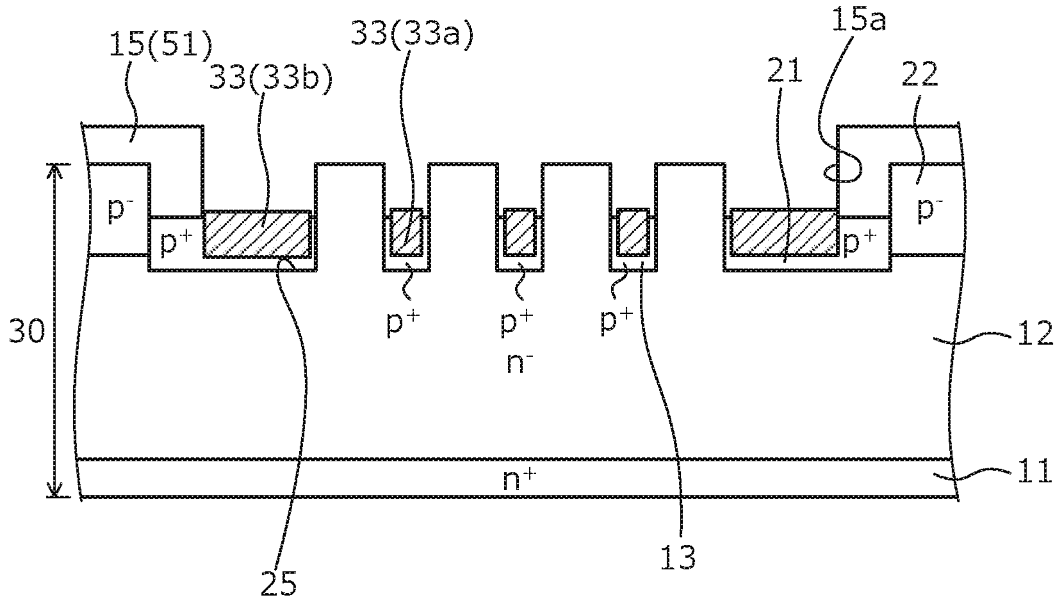
FIG. 25 is a cross-sectional view a depicting state of the silicon carbide semiconductor device according to the second embodiment during manufacture.

Next, as depicted in FIG. 25, a resist film (not depicted) having an opening that corresponds to a formation region of the contact hole 15*a* of the field oxide film 15 is formed by photolithography. Next, etching is performed using the resist film as a mask, whereby the contact hole 15*a* that penetrates through the field oxide film 15 in the depth direction is formed (step S11: the eleventh process). In the process at step S11, only the portion of the oxide film 51 constituting the field oxide film 15 is left.

Figure 26:
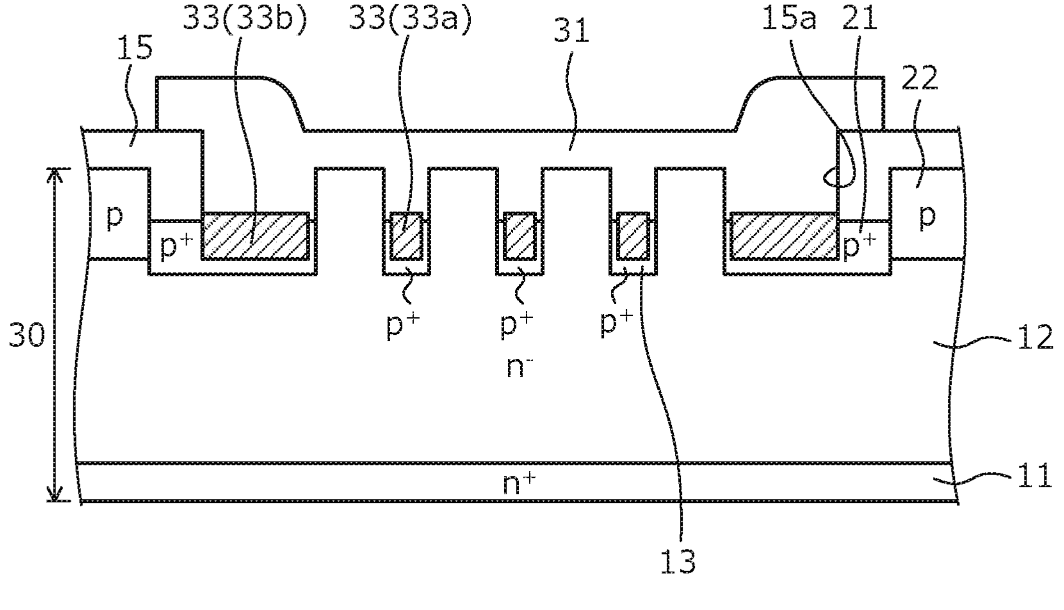
FIG. 26 is a cross-sectional view a depicting state of the silicon carbide semiconductor device according to the second embodiment during manufacture.
Figure 27:
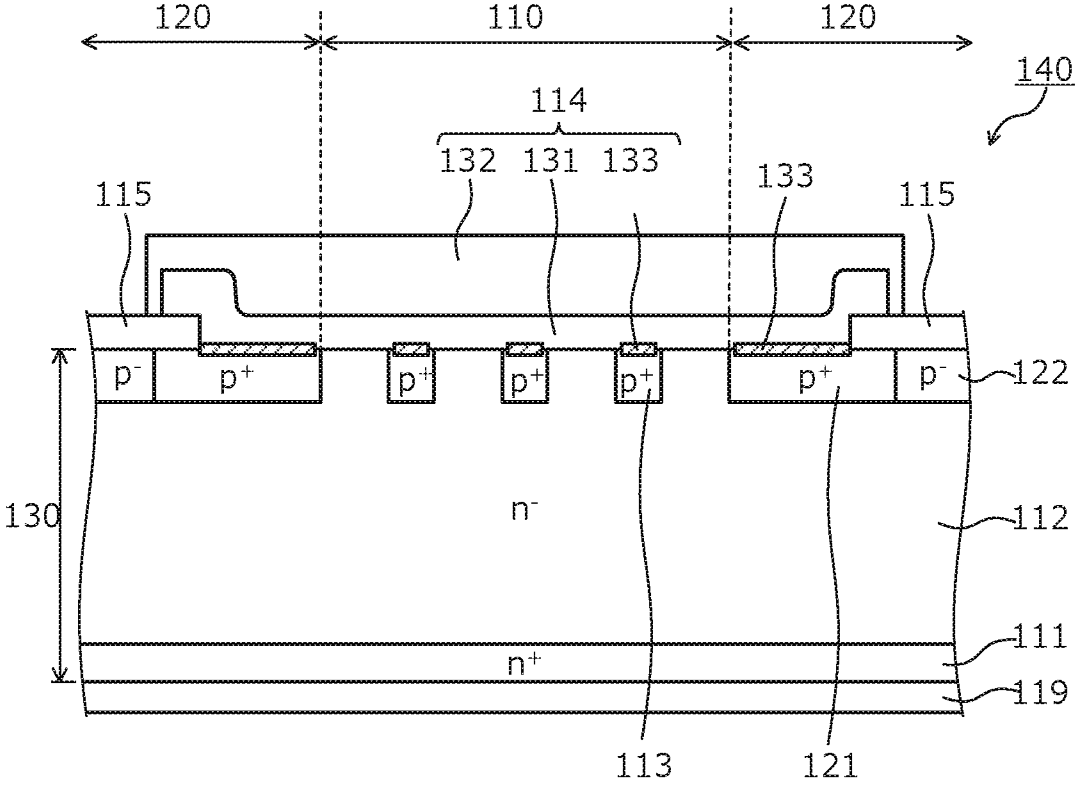
FIG.27 RELATED ART
FIG. 27 is a cross-sectional view depicting a structure of a conventional silicon carbide semiconductor device.

Next, as depicted in FIG. 26, for example, by a physical vapor deposition (PVD) such as sputtering, the titanium film 31 is formed in an entire area, from the surface of the field oxide film 15 to the front surface of the semiconductor substrate 30 in the contact hole 15*a*. Next, by photolithography and etching, the titanium film 31 is left only in the contact hole 15*a* (step S12). The thickness of the titanium film 31 may be, for example, about 100 nm. The titanium film 31 may extend from inside the contact hole 15*a*, onto the field oxide film 15.

Next, for example, sintering is performed to the titanium film 31 by a heat treatment for about 10 minutes at a temperature of about 500 degrees C. The Schottky junctions between the titanium film 31 and the $n^-$-type drift region 12 are formed by the heat treatment. Next, for example, by physical vapor deposition such as sputtering, from the surface of the titanium film 31, an aluminum alloy film of a thickness of, for example, about 5 μm is formed in an entire area of the surface of the field oxide film 15. Next, the aluminum alloy film is selectively removed by photolithography and etching, thereby leaving a portion of the aluminum alloy film as the aluminum alloy film 32 constituting the front electrode 14 at the surface of the titanium film 31 (the twelfth process).

Next, the front surface of the semiconductor substrate 30 (semiconductor wafer) is covered by a protective film (not depicted) and thereafter, the semiconductor substrate 30 is polished from the back surface, whereby the thickness of the semiconductor substrate 30 is reduced to the product thickness. Next, for example, nickel, titanium, etc. is deposited in an entire area of the back surface (back surface of the $n^+$-type starting substrate 11) of the semiconductor substrate 30 by physical vapor deposition such as sputtering and thereafter, the back electrode 19 is formed by laser annealing (step S13: thirteenth process). Thereafter, the protective film covering the front surface of the semiconductor substrate 30 is removed and thereafter, the semiconductor substrate 30 is diced (cut) into individual chips, whereby the silicon carbide semiconductor device 40 depicted in FIG. 1 is completed.

As described above, according to the second embodiment, the fine ohmic striped structure is provided in the JBS striped structure, thereby forming the trench structure, and the thick nickel silicide films are provided at the bottoms of the first trenches. As a result, the area of the SBD structure configured by the Schottky junctions increases, the on-voltage increases, Vf may be reduced, the surface area of the first nickel silicide films 33*a* may be increased, and the flow of current to the $p^+$-type regions during surges is facilitated, whereby surge current withstanding capability (IFSM) may be ensured. Thus, the characteristics of both the surge current withstanding capability and the on-voltage may be improved.

In the foregoing, the present invention is not limited to the embodiments described above, various modifications not departing from the spirit of the invention are possible, and application is possible to silicon carbide semiconductor devices having an ohmic electrode in ohmic contact with p-type regions disposed in a predetermined pattern.

In particular, for example, the present invention is useful for silicon carbide semiconductor devices having a configuration for lowering contact resistance between an ohmic electrode and a p-type region (or a $p^+$-type contact region disposed between the p-type region and a main surface of the semiconductor substrate), and silicon carbide semiconductor devices having a structure in which an ohmic electrode in ohmic contact with a p-type region and an oxide film are in contact with each other.

According to the invention described above, the fine ohmic striped structure is provided in the JBS striped structure, thereby forming the two-step trench structure. As a result, the area of the SBD structure configured by the Schottky junctions is increased, the on-voltage increases, and Vf may be reduced. Furthermore, the surface area of the first nickel silicide films 33*a* may be increased and the flow of current to the $p^+$-type regions (first second-conductivity-type regions) during surges is facilitated, whereby surge current withstanding capability (IFSM) may be ensured. Thus, the characteristics of both the surge current withstanding capability and the on-voltage may be improved.

The silicon carbide semiconductor device and the method of manufacturing a silicon carbide semiconductor device according to the present invention achieve an effect in that a low-resistance ohmic electrode is formed, whereby low Vf characteristics are maintained and surge current withstanding capability may be increased.

As described, the silicon carbide semiconductor device and the method of manufacturing a silicon carbide semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:

a semiconductor substrate containing silicon carbide and having an active region and an edge termination region that surrounds a periphery of the active region, the semiconductor substrate having a first main surface and a second main surface that are opposite to each other;

a first-conductivity-type region provided in the semiconductor substrate and having a first surface and a second surface that are opposite to each other, the first surface being exposed at the first main surface of the semiconductor substrate;

a first trench in the active region, provided in the first-conductivity-type region from the first surface of the first-conductivity-type region;

a first second-conductivity-type region provided at a bottom of the first trench, in the active region, the first second-conductivity-type region being in contact with the first-conductivity-type region;

a first electrode in contact with the first second-conductivity-type region and the first-conductivity-type region, the first electrode including a silicide film in ohmic contact with the first second-conductivity-type region;

a second electrode provided at the second main surface of the semiconductor substrate; and a second second-conductivity-type region surrounding the active region and provided in the edge termination region, wherein the active region is configured by an ohmic region in which the silicide film is in contact with the first second-conductivity-type region, a plurality of non-operating regions in which the first electrode is in contact with the first second-conductivity-type region, and a Schottky region in which the first electrode is in contact with the first-conductivity-type region, the ohmic region, the plurality of non-operating regions, and the Schottky region form a striped pattern, stripes of which extend in a first direction, a bottom of the silicide film that is a portion of the silicide film closer to the second main surface of the semiconductor substrate than are the rest of portions of the silicide film in the ohmic region is positioned closer to the second main surface of the semiconductor substrate than is an interface between the first electrode and the first second-conductivity-type region in each of the plurality of non-operating regions, a width of the silicide film in a second direction orthogonal to the first direction is less than a width of the first second-conductivity-type region, and a width of each of plurality of the non-operating regions in the second direction is in a range of 0.1 μm to 1.0 μm.

2. The silicon carbide semiconductor device according to claim 1, wherein the first second-conductivity-type region has a first surface and a second surface that are opposite to each other, the silicon carbide semiconductor device further comprises in the active region, a second trench provided in the first second-conductivity-type region from the first surface of the first second-conductivity-type region, wherein the silicide film is provided at a bottom and sidewalls of the second trench.

3. The silicon carbide semiconductor device according to claim 1, wherein a top of the silicide film that is a portion of the silicide film farther from the second main surface of the semiconductor substrate than are the rest of portions of the silicide film in the ohmic region is positioned farther from the second main surface of the semiconductor substrate than is the interface between the first electrode and the first second-conductivity-type region in each of the plurality of non-operating regions.

4. The silicon carbide semiconductor device according to claim 1, wherein an amount of a surface area of the plurality of non-operating regions is in a range of 5% to 35% of an amount of a surface area of the silicon carbide semiconductor device.

5. The silicon carbide semiconductor device according to claim 1, wherein an amount of a surface area of the plurality of non-operating regions is in a range of 35% to 90% of an amount of a surface area of the first second-conductivity-type region.

6. The silicon carbide semiconductor device according to claim 1, wherein an amount of a surface area of the plurality of non-operating regions is in a range of 15% to 40% of an amount of a surface area of the active region.

7. A silicon carbide semiconductor device, comprising:

a semiconductor substrate containing silicon carbide and having an active region and an edge termination region that surrounds a periphery of the active region, the semiconductor substrate having a first main surface and a second main surface that are opposite to each other;

a first-conductivity-type region provided in the semiconductor substrate and having a first surface and a second surface that are opposite to each other, the first surface being exposed at the first main surface of the semiconductor substrate;

a first trench in the active region, provided in the first-conductivity-type region from the first surface of the first-conductivity-type region;

a first second-conductivity-type region provided at a bottom of the first trench, in the active region, the first second-conductivity-type region being in contact with the first-conductivity-type region;

a first electrode in contact with the first second-conductivity-type region and the first-conductivity-type region, the first electrode including a silicide film in ohmic contact with the first second-conductivity-type region;

a second electrode provided at the second main surface of the semiconductor substrate;

a second second-conductivity-type region surrounding the active region and provided in the edge termination region; and in the edge termination region, a third trench provided in the first-conductivity-type region from the first surface of the first-conductivity-type region, wherein the active region is configured by an ohmic region in which the silicide film is in contact with the first second-conductivity-type region, a plurality of non-operating regions in which the first electrode is in contact with the first second-conductivity-type region, and a Schottky region in which the first electrode is in contact with the first-conductivity-type region, the ohmic region, the plurality of non-operating regions, and the Schottky region form a striped pattern, stripes of which extend in a first direction, a bottom of the silicide film that is a portion of the silicide film closer to the second main surface of the semiconductor substrate than are the rest of portions of the silicide film in the ohmic region is positioned closer to the second main surface of the semiconductor substrate than is an interface between the first electrode and the first second-conductivity-type region in each of the plurality of non-operating regions, and the second second-conductivity-type region is selectively provided in contact with the first-conductivity-type region in the third trench, and has a side facing the active region in contact with the first electrode.

8. The silicon carbide semiconductor device according to claim 7, wherein a width of the third trench in a second direction orthogonal to the first direction is greater than a width of the first trench.

9. The silicon carbide semiconductor device according to claim 1, wherein the first second-conductivity-type region and the second second-conductivity-type region are physically connected to each other.

* * * * *